(12) United States Patent
Komatsu

(10) Patent No.: US 10,756,716 B2
(45) Date of Patent: Aug. 25, 2020

(54) ELECTRONIC DEVICE AND NOISE REMOVAL SYSTEM

(71) Applicant: FANUC CORPORATION, Yamanashi (JP)

(72) Inventor: Takaaki Komatsu, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/740,310

(22) Filed: Jan. 10, 2020

(65) Prior Publication Data

US 2020/0244255 A1 Jul. 30, 2020

(30) Foreign Application Priority Data

Jan. 30, 2019 (JP) .................................. 2019-014386

(51) Int. Cl.
- *H03K 5/1252* (2006.01)
- *H03K 21/08* (2006.01)
- *H03K 5/00* (2006.01)

(52) U.S. Cl.
CPC ........... *H03K 5/1252* (2013.01); *H03K 21/08* (2013.01); *H03K 2005/00078* (2013.01)

(58) Field of Classification Search
None
See application file for complete search history.

(56) References Cited

U.S. PATENT DOCUMENTS

| | | | |
|---|---|---|---|
| 2002/0125914 A1* | 9/2002 | Kim | .......................... G06F 1/08 326/93 |
| 2003/0146778 A1* | 8/2003 | McMahan | ............ H03K 5/1252 327/34 |
| 2015/0188442 A1* | 7/2015 | Kesterson | ......... H02M 3/33523 363/21.15 |

FOREIGN PATENT DOCUMENTS

JP 2009-225153 A 10/2009

* cited by examiner

*Primary Examiner* — Cassandra F Cox
(74) *Attorney, Agent, or Firm* — Studebaker & Brackett PC

(57) ABSTRACT

An electronic device according to the present disclosure is an electronic device having a function of removing glitches contained in a signal, and includes a glitch removal circuit which removes glitches from an inputted signal, and a count unit which counts a number of times removing glitches.

15 Claims, 16 Drawing Sheets

ELECTRONIC DEVICE AND NOISE REMOVAL SYSTEM

This application is based on and claims the benefit of priority from Japanese Patent Application No. 2019-014386, filed on 30 Jan. 2019, the content of which is incorporated herein by reference.

BACKGROUND OF THE INVENTION

Field of the Invention

The present invention relates to an electronic device and a noise removal system.

Related Art

In electrical circuits, pulse noise of a whisker shape shorter than the normal pulse width is called a glitch. In logical circuits, if two input signals change in adjacent times, glitches may occur in the output. This is a phenomenon caused by the signal delay time of two signals, and is called racing.

In addition, when a plurality of output terminals in an integrated circuit or the like changes in the same direction simultaneously, racing may occur in adjacent terminals, and this is called simultaneous switching noise. As a separate example, in the case where there is two signals running parallel, a glitch may occur in the other when one changes, and this is called crosstalk. Even apart from this, a glitch can occur for various causes such as electrostatic discharge or a radiation field.

These glitches adversely affect logical circuits in the following stage. Therefore, a circuit for removing glitch noise has been proposed (for example, refer to Patent Document 1).

Patent Document 1: Japanese Unexamined Patent Application, Publication No. 2009-225153

SUMMARY OF THE INVENTION

With the glitch removal circuit disclosed in Cited Document 1, a signal is inputted to n stages of D flip-flop circuits. In the case where the respective outputs of the n stages of D flip-flop circuit match, the output of the last stage among the n stages of D flip-flops is outputted. On the other hand, in the case where the respective outputs of the n stages of D flip-flop circuit does not match, it is determined that glitch noise occurred. Then, by the previous output of the last stage among the n stages of D flip-flops being maintained, the glitch noise is removed.

However, when glitch noise of large pulse width such that cannot be removed by a glitch removal circuit occurs, it becomes a fatal error. Therefore, it has been demanded to configure so as not to allow glitch noise of large pulse width such that is irremovable to occur. As the cause for the occurrence of glitch noise in a signal, the installation environment of the logic circuit, inferior parts (deterioration), etc. can be considered. In addition, prior to glitch noise of large pulse width which is irremovable occurring, the possibility of glitch noise of small pulse width which is removable occurring can be considered. Therefore, at the stage where glitch noise of small pulse width which is removable occurs, it has been desired to record an event of this glitch noise being removed. It has been desired to record the number of times removing glitch noise.

The electronic device according to an aspect of the present disclosure is an electronic device having a function of removing glitches included in signals, and includes a glitch removal circuit for removing glitches in an inputted signal, and a count unit for counting a number of times removing glitches.

According to an aspect of the present disclosure, it is possible to remove glitch noise from input signals, and counts a number of times removing glitch noise and records this number of times.

DETAILED DESCRIPTION OF THE INVENTION

Hereinafter, each embodiment of an electronic device according to the present disclosure will be explained while referencing FIGS. 1 to 15.

First Embodiment

Figure 1:
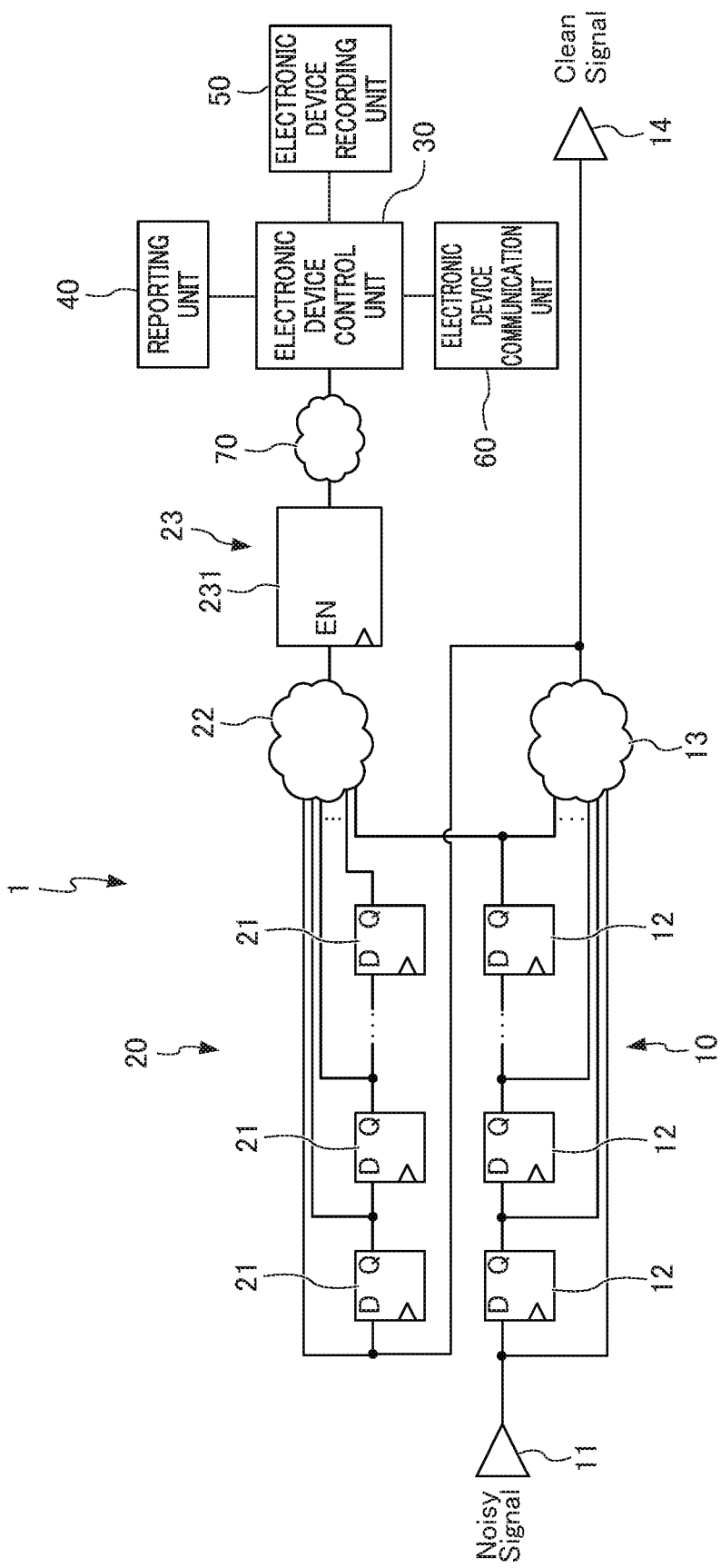
FIG. 1 is a circuit diagram showing an electronic device according to a first embodiment of the present disclosure.

FIG. 1 is a circuit diagram showing an electronic device 1 according to a first embodiment of the present disclosure.

The electronic device 1 has a function of removing glitches included in signals. It should be noted that, in the following explanation, "glitch noise" and "glitch" may be explained simply as "glitch".

The electronic device 1 includes: a glitch removal circuit 10 which removes glitches from the inputted signal; a count unit 20 which counts a number of times that the glitch removal circuit 10 removed glitches; an electronic device control unit 30 which performs control based on a count number of the count unit 20; a reporting unit 40 which, in a case where the count number of the count unit 20 exceeds a predetermined threshold value, reports this event; an electronic device recording unit 50 which leaves the count number of the count unit 20 in a log periodically or when a predetermined event occurs; and an electronic device communication unit 60 which communicates with external equipment.

The glitch removal circuit 10 includes: a signal input terminal 11, n stages of original signal delay element 12 (n is an integer of 1 or more); an output signal generation unit 13 which generates an output signal; and a signal output terminal 14 which outputs the output signal.

The signal input terminal 11 is a terminal connected to an external device which is not shown. The signal input terminal 11 accepts the input of signals outputted from the external device. The signal input terminal 11, for example, accepts the input of signals having a possibility of including glitches due to influences such as installation environment of external devices, and inferior parts (deterioration). It should be noted that, in a case where the signal inputted to the signal input terminal 11 is non-synchronous with the glitch removal circuit 10, a plurality of stages of D flip-flops (typically 2 or 3 stages) called a synchronizer (not shown) may be inserted between the signal input terminal 11 and glitch removal circuit 10, and the input signals may be synchronized. Hereinafter, the signal inputted to the signal input terminal 11 or signal after passing through the synchronizer is also called "original signal".

The n stages of original signal delay elements 12 are a circuit to which the original signal is inputted. Among the n stages of original signal delay elements 12, the input terminal of the $1^{st}$ stage of original signal delay element 12 is connected to the signal input terminal 11. In addition, the output terminal of the $1^{st}$ stage original signal delay element 12 is connected to the input terminal of the next stage original signal delay element 12. The output terminal of the next stage of original signal delay element 12 is connected to the input terminal of the next successive original signal delay element 12. By configuring in this way, the n stages of original signal delay elements 12 are configured to be connected in series to the signal input terminal 11. In the present embodiment, each of the n stages of original signal delay elements 12 is a D flip-flop, for example. To each of the n stages of original signal delay elements 12, a clock signal including the same rise timing is inputted. The $1^{st}$ stage of original signal delay element 12 latches the output (original signal) of the signal input terminal 11 or the synchronizer during rising of the clock signal. In addition, each of the n−1 stage original delay element 12 after the second stage latches the output of the prior stage during rising of the clock signal. It should be noted that the circuit inputting the clock signal is omitted from illustration for simplification.

The output signal generation unit 13 is a circuit which generates an output signal from a signal outputted from each of the n stages of original signal delay elements 12 and the original signal. The input terminal of the output signal generation unit 13 is connected to each of the outputs of the n stages of original signal delay elements 12 and the signal input terminal 11.

The signal output terminal 14 is a terminal which outputs a signal from which a glitch was removed. The signal output terminal 14 is connected to the output terminal of the output signal generation unit 13.

The count unit 20 includes n stages of output signal delay elements 21 to which an output signal is inputted; a determination signal generation unit 22 which generates a determination signal indicating the presence/absence of removal of glitches by the glitch removal circuit 10; and an increment unit 23 which counts the number of times removing glitches based on the determination signal generation unit 22.

The n stages of output signal delay elements 21 are a circuit to which the original signal is inputted. Among the n stages of output signal delay elements 21, the input terminal of the $1^{st}$ output signal delay element 21 is connected to the output terminal of the output signal generation unit 13. In addition, the output terminal of the $1^{st}$ output signal delay element 21 is connected to the input terminal of the next stage of output signal delay element 21. The output terminal of the next stage of output signal delay element 21 is connected to the input terminal of the next successive stage output signal delay element 21. By configuring in this way, the n stages of output signal delay elements 21 are configured to be consecutively connected to the output signal generation unit 13. In the present embodiment, each of the n stages of output signal delay elements 21 is a D flip-flop, for example. Clock signals including the same rising timing are inputted to each of the n stages of output signal delay elements 21. The $1^{st}$ stage of output signal delay element 21 latches the current output signal at the rising time of the clock signal. In addition, the $2^{nd}$ and later stages of output signal delay elements 21 latch the output of each prior stage output signal delay element 21 at the rising time of the clock signal.

The determination signal generation unit 22 generates a determination signal indicating the presence/absence of removal of glitches from the current output signal and the signal outputted from the output signal delay element 21, and the signal outputted from the final stage of the original signal delay elements 12.

The increment unit 23 has an incrementer 231 which increments and retains the number of times removing glitches. The incrementer 231 is a circuit which increments (counts) the number of times removing glitches. The increment unit of the present embodiment directly inputs the determination signal outputted by the determination signal generation unit 22 to the input terminal of the incrementer 231. The output terminal of the incrementer 231 is connected to an electronic device control unit 30 described later, via a bus 70 or the like.

The incrementer 231, for example, is configured from an adder or register. In a case where the determination signal is a high level, the incrementer 231 adds +1 (increments) to the number of times removing glitches stored in the register.

The count unit 20 confirms the presence/absence of removal of a glitch every clock cycle, and increments the incrementer 231. In other words, the count unit 20, in a case where the time band of a glitch removed by the glitch removal circuit 10 is at least two clock cycles, counts the number of times removing glitches as a plurality of times.

The electronic device control unit 30 can be established as a configuration having a processor (CPU) performing operations instructed by a program. It acquires the output value of the incrementer 231, and controls the reporting unit 40, electronic device recording unit 50 and electronic device communication unit 60 described later.

As a specific example, the electronic device control unit 30 has a function as a judgment unit which judges whether the number of times removing glitches exceeds a predetermined threshold value in order to control the reporting unit 40. In addition, the electronic device control unit 30 has a function of determining a timing at which recording a count number in the electronic device recording unit 50. In addition, the electronic device control unit 30 has a function of handing over the count number transmitted externally to the electronic device communication unit 60. Various functions of such an electronic device control unit 30 can be realized by a part of a program instructing operation of each processor.

The reporting unit 40 is, for example, a display device such as a monitor having a screen, a playback device which generates sound, or an output device having a light source or the like which illuminates. The reporting unit 40 can be configured so as to report an event of the number of times counted according to the display, generation of sound, illumination of the light source, etc. exceeding a predetermined threshold value. The reporting unit 40 may prompt an improvement in installation environment or parts replacement.

The electronic device recording unit 50 can be established as a configuration having a storage device such as memory or a hard disk drive. The electronic device recording unit 50 preferably records the count number of the count unit 20 and the time at which confirming this count number.

As an event of recording the count number in the electronic device recording unit 50, for example, it is possible to exemplify the occurrence of a fatal error or the like, for example.

The electronic device communication unit 60 functions as a count transmission unit which externally transmits the count number of the count unit 20. The electronic device communication unit 60 can be established as a configuration including an Ethernet communication module, wireless communication modules, etc.

In addition, the electronic device communication unit 60, in a case where the number of times removing glitches exceeds a predetermined threshold value, can also be used as a second reporting unit which transmits information indicating that the count number of the count unit 20 has exceeded a predetermined threshold value to external equipment.

The electronic device 1 of the first embodiment of the present disclosure explained above exerts effects such as those explained below.

The electronic device 1 is an electronic device 1 having a function of removing glitches included in signals, and includes the glitch removal circuit 10 that removes glitches from the inputted signal, and the count unit 20 that counts the number of times removing glitches. It is thereby possible to count the number of times removing the glitch noise from input signals, and record this number of times. Therefore, the electronic device 1 can confirm the number of times removing glitches, for example, number of times removing glitches in a shipping inspection of the electronic device 1, or the like. So long as the number of times removing glitches is other than zero times, it is thereby possible to reject a unit of this electronic device 1. In addition, during substrate development or during device development, by performing testing which applies noise, it is possible to evaluate the noise resistance of the substrate or device. If the number of times removing glitches is small, it is considered that the noise resistance of the substrate or device is high (good design). Conversely, if the number of times removing glitches is many, it is considered that the noise resistance of the substrate or device is low (poor design). By configuring in this way, it can be put to use in the improvement of design of the substrate or device.

In the electronic device 1, the glitch removal circuit 10 includes n stages of original signal delay elements 12 to which the original signal is inputted, and the output signal generation unit 13 which generates an output signal from the signal outputted from the original signal delay element 12 and the original signal. It is thereby possible to output the output signal from which glitches have been appropriately removed. In addition, in the electronic device 1, the count unit 20 includes: n stages of output signal delay elements 21 to which output signals are inputted; the determination signal generation unit 22 which generates a determination signal indicating the presence/absence of removal of glitches from the current output signal and the signal outputted from the output signal delay element, and the signal outputted from the last stage of original signal delay elements 12; and the increment unit 23 which has the incrementer 231 that increments and retains the number of times removing glitches, and increments the incrementer 231 based on the determination signal. It is thereby possible to accurately count the number of times removing glitches.

The electronic device 1 further includes the electronic device control unit 30 which judges whether the count number of the count unit 20 has exceeded a predetermined threshold value, and the reporting unit 40 which notifies of an event of the count number of the count unit 20 exceeding the predetermined threshold value. It is thereby possible to notify in a case where the glitches exceeds a predetermined number of times. According to this configuration, it is possible to prompt an improvement before the occurrence of an error by a large glitch, since it is possible to notify prior to an irremovable large glitch is inputted.

In the electronic device 1, the reporting unit 40 can display on a screen the event of the count number of the count unit 20 exceeding a predetermined threshold value. It is thereby possible to notify in an easy to understand manner the event of glitches exceeding a predetermined number of times.

In the electronic device 1, the electronic device communication unit 60 serving as the second reporting unit externally transmits the information indicating that the count number of the count unit 20 has exceeded the predetermined threshold value. Since it is thereby possible to allow the event of glitches exceeding a predetermined number of times to be recognized in external equipment, it is possible to configure a system such that collectively grasps the states of a plurality of electronic devices 1.

The electronic device 1 further includes the electronic device recording unit 50 which leaves the count number of the count unit in the log periodically or when a predetermined phenomenon occurred. It is thereby possible to confirm a change in the occurrence status of glitches later.

Second Embodiment

Figure 2:
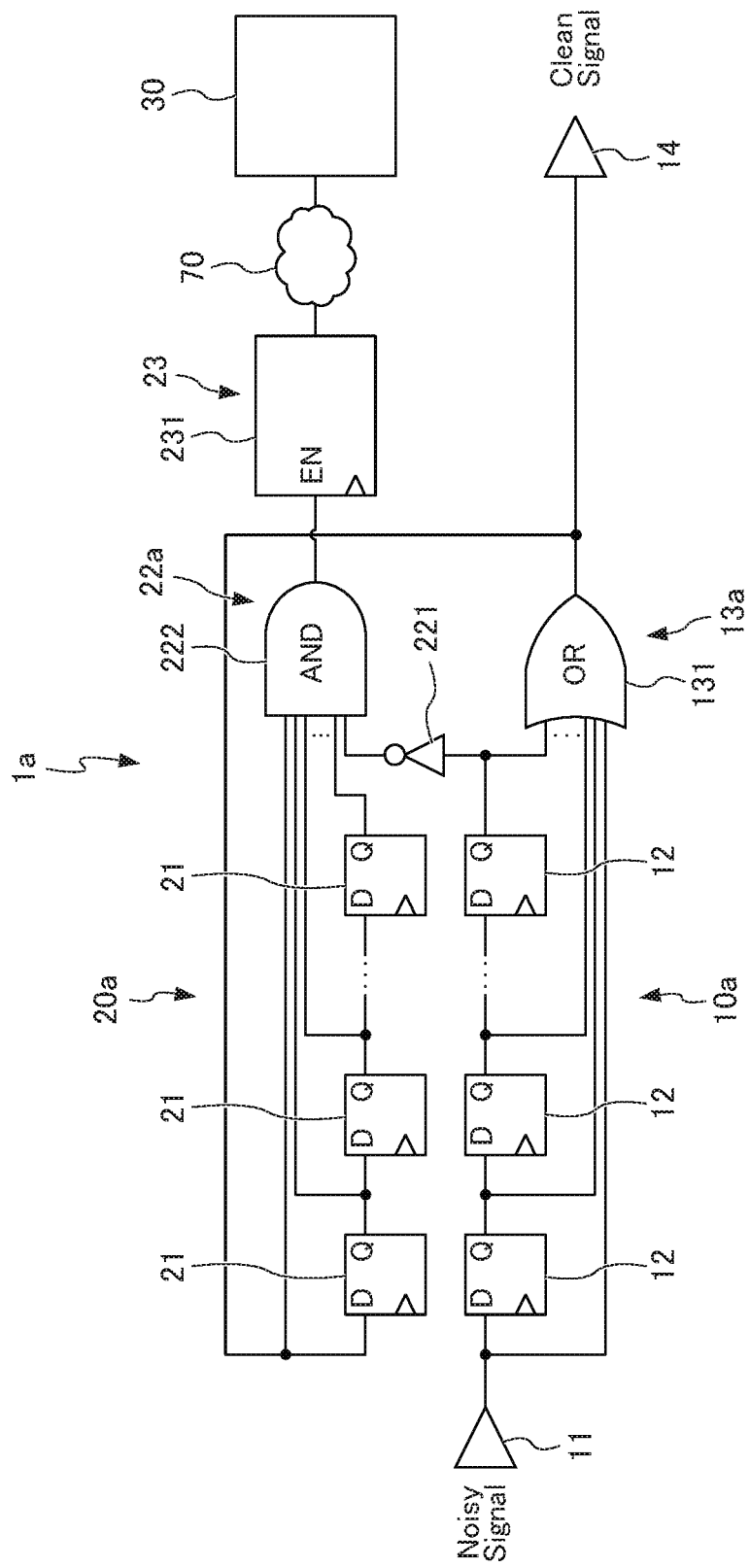
FIG. 2 is a circuit diagram showing an electronic device according to a second embodiment of the present disclosure.

FIG. 2 is a circuit diagram showing an electronic device 1a according to a second embodiment of the present disclosure. The electronic device 1 is a device which removes glitches in a low level direction appearing in the input signal of high level. It should be noted that, in the following explanation, the same reference symbols are attached to constituent elements which are the same as in the previously explained embodiment, and redundant explanations may be omitted.

The electronic device 1a of the present embodiment includes: a glitch removal circuit 10a which removes glitches from the inputted signal; a count unit 20a which counts a number of times that the glitch removal circuit 10a removed glitches; and an electronic device control unit 30 which performs control based on the count number of the count unit 20a.

The electronic device control unit 30 in the electronic device 1a of the present embodiment is similar to the electronic device control unit 30 of the electronic device 1 of the first embodiment. The electronic device 1a of the present embodiment also can include the reporting unit 40, the electronic device recording unit 50 and electronic device communication unit 60; however, illustration and explanation thereof will be omitted.

The glitch removal circuit 10a includes: the signal input terminal 11, n stages of the original signal delay elements 12 (n is an integer of 1 or more), an output signal generation unit 13a which generates an output signal; and the signal output terminal 14 which outputs the output signal.

The output signal generation unit 13a is an output generation OR circuit 131 which outputs a logical sum. The output signal generation unit 13a outputs the logical sum of the original signal and the signal outputted from each of the n stages of original signal delay elements 13.

With the above glitch removal circuit 10a, the original signal is inputted to the signal input terminal 11. For this reason, a signal having a possibility of including glitch noise in the low level direction when being high level is inputted to the original signal delay element 12. The n stages of original signal delay elements 12 latch the original signal or the output signal of the prior stage of original signal delay element 12 to match the rise in clock signal. The original signal is inputted to the output signal generation unit 13a. In addition, the output of each of the original signal delay elements 12 is inputted to the output signal generation unit 13a.

In the case where the glitch overlaps the rise of clock and has a sufficient pulse width to satisfy the setup time and hold time, the $1^{st}$ stage of original signal delay elements 12 latches the low level according to the rising of the clock. At this time, in the next rise of the clock, the second stage of original signal delay element 12 latches the low level, which is the output of the $1^{st}$ stage of original signal delay element 12. In the next rising of the clock, the $3^{rd}$ stage of original signal delay element 12 latches the low level, which is the output of the $2^{nd}$ stage of original signal delay element 12. By configuring in this way, the $n^{th}$ stage of original signal delay element 12 latches the low level, at the $n^{th}$ time of rising of the clock signal. However, since another original signal delay element 12 is latching the high level, the output signal generation unit 13a outputs the high level.

The output signal generation unit 13a outputs the high level, unless the original signal is low level and all of the n stages of original signal delay elements 12 are latching the low level. In other words, the output signal generation unit 13a outputs the high level, unless the low level continues n+1 times in the original signal. The glitch removal circuit 10a can thereby remove glitches of the low level direction of a width up to the $n^{th}$ clock cycle.

The count unit 20a includes n stages of output signal delay elements 21 to which the output signal is inputted; the determination signal generation unit 22a which generates a determination signal indicating the presence/absence of removal of glitches by the glitch removal circuit 10; and the increment unit 23 which counts the number of times removing glitches, based on the determination signal generation unit 22a.

The determination signal generation unit 22a includes: a delay signal inverter 221 which inverts the signal outputted from the last stage of original signal delay elements 12; and a determination AND circuit 222 to which the output of the delay signal inverter 221, the current output signal and signal outputted from all output signal delay elements 21 are inputted, and outputs the logical product thereof.

The determination signal generation unit 22a outputs a determination signal which becomes a high level indicating having removed a glitch only in a case where the current output signal and the output signal of the past n times are high level, and the original signal of the previous n times is low level; and becomes the low level in other cases.

Figure 3:
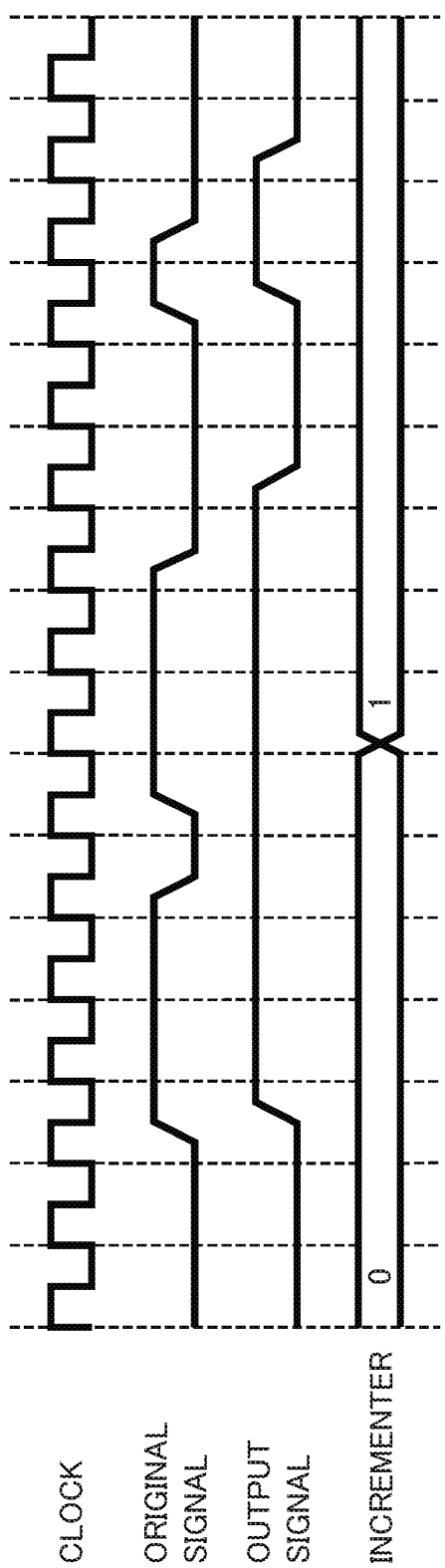
FIG. 3 is a time chart showing the changes in input signal, output signal and increment value of the electronic device in FIG. 2.

FIG. 3 shows the change over time of the clock signal, original signal and output signal, as well as count of the incrementer 231 in the electronic device 1a. It should be noted that FIG. 3 is a case of n=1.

The output signal generation unit 13a causes the output signal to transition to the high level if the original signal becomes high level. The output signal generation unit 13a, in a case where the output signal is the high level, maintains the output signal as the high level, so long as the original signal does not become low level during rising of the clock signal for at least n+1 times consecutively. For this reason, the output signal transitions to the low level at the rising time of the clock signal delayed by n clock cycles after the original signal becomes the low level. For this reason, the output signal generation unit 13a, even if the original signal becomes low level for a short time of no more than n clock cycles due to glitch noise, maintains the output signal as the high level, i.e. outputs the output signal from which glitches were removed.

The determination signal generation unit 22a sets the determination signal to the high level only in the case where the output signal continuously is the high level n+1 times from n times previous until current, and the output of the last stage of original signal delay element 12 outputting the same value as the original signals of the previous n times being a low level indicating a glitch. In other words, the determination signal generation unit 22a outputs a determination signal indicating that the glitch was removed, when the output signal is retained n+1 times as the high level irrespective of the original signal being the low level during rising of the clock the previous n times.

The increment unit 23 increments the count of the incrementer 231 one by one every time the determination signal outputted from the determination signal generation unit 22a becomes the high level. In the case where n is at least 2, and the glitch spanning a plurality of risings of the clock, the determination signal generation unit 22a maintains the determination signal at the high level over a plurality of clock cycles. Therefore, in the case where the width of the glitch is large, the count of the incrementer 231 comes to increase by 1 or more.

According to the electronic device 1a of the second embodiment explained above, in addition to the effects of the first embodiment previously explained, the following such effects are also exerted.

In the electronic device 1a, the determination signal generation unit 22a generates a determination signal which has a value indicating having removed a glitch, in the case where the current output signal and the signals outputted from all of the output signal delay elements 21 is equal, and the current output signal and the signal outputted from the final stage of original signal delay elements 12 is different. It is thereby possible to accurately count the number of times glitches were removed.

In the electronic device 1a, the original signal delay element 12 is an element to which a signal having a possibility of including glitch noise of the low level direction when the high level is inputted, and the output signal generation unit 13a outputs the logical product of the signals outputs form each of the original signal delay elements and the original signal. In a case other than all of the outputs of the original signal delay elements 12 and the original signal not being the high level, the output signal generation unit 13a thereby outputs the high level. Therefore, even in a case where the pulse width of a glitch spans a plurality of rising of the clock, it is possible to remove the glitch.

Third Embodiment

Figure 4:
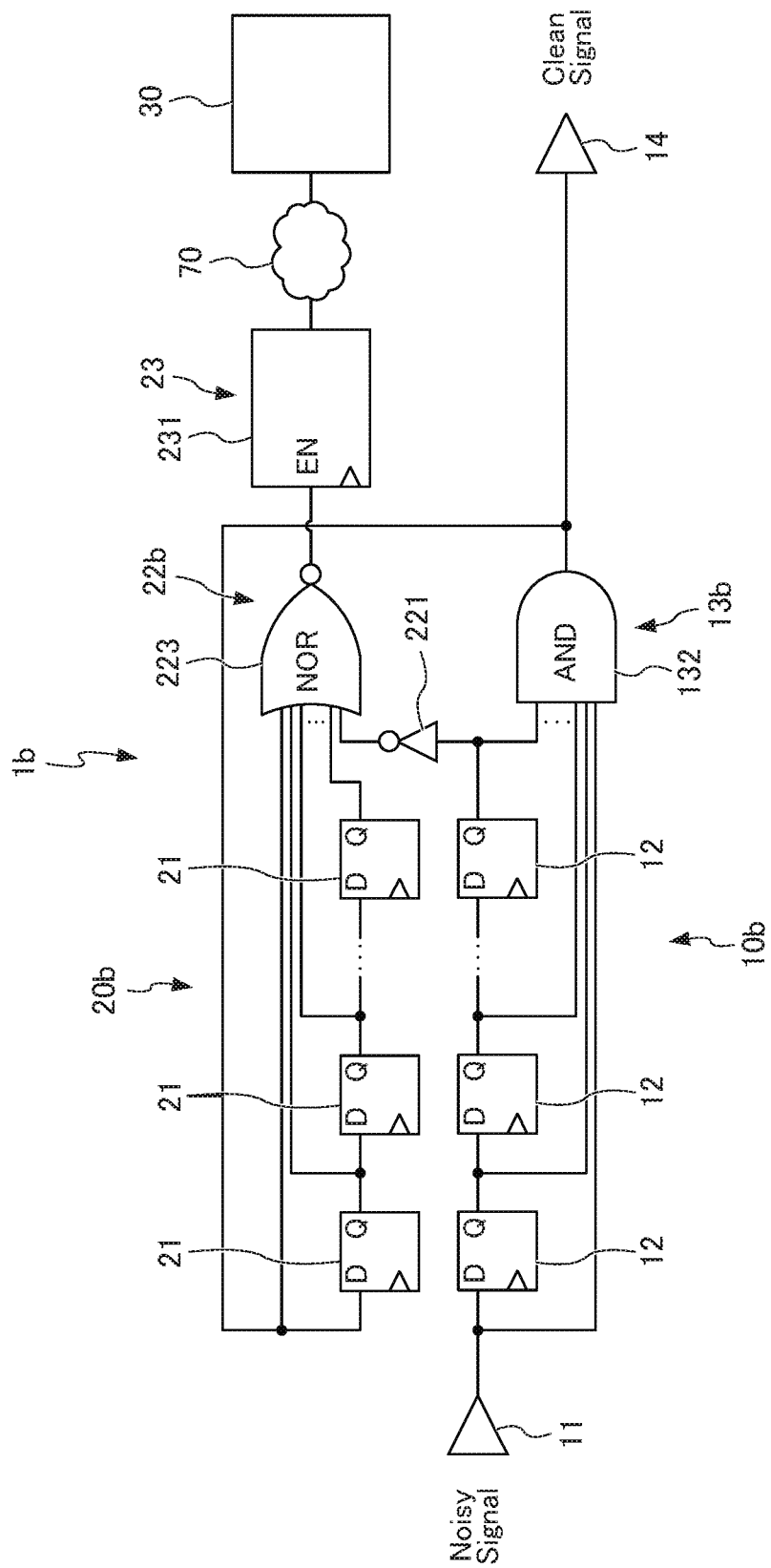
FIG. 4 is a circuit diagram showing an electronic device according to a third embodiment of the present disclosure.

FIG. 4 is a circuit diagram showing an electronic device 1b according to a third embodiment of the present disclosure. The electronic device 1b is a device which removes a glitch in the high level direction appearing in the input signal which is low level.

The electronic device 1b of the present embodiment includes: a glitch removal circuit 10b which removes a glitch from the inputted signal; a count unit 20b which counts a number of times that the glitch removal circuit 10b removed glitches; and an electronic device control unit 30 which performs control based on the count number of the count unit 20b.

The electronic device control unit 30 in the electronic device 1b of the third embodiment is similar to the electronic device control unit 30 in the electronic device 1 of the first embodiment.

The glitch removal circuit 10b includes the signal input terminal 11, n stages (n is an integer of 1 or more) of original signal delay elements 12, an output signal generation unit 13b which generates an output signal, and the signal output terminal 14 which outputs the output signal.

The output signal generation unit 13b is an output generation AND circuit 132 which outputs the logical product of the signals outputted from each of the n stages of original signal delay elements 12 and the original signal.

With the glitch removal circuit 10b, a signal having a possibility of including glitch noise in the low level direction while being the high level is inputted to the original signal delay element 12.

The output signal generation unit 13b outputs a low level unless the original signal is the high level, and all n stages of original signal delay elements 12 are latching the high level. In other words, the output signal generation unit 13b outputs the low level unless the high level continues n+1 times in the original signal. The glitch removal circuit 10b can thereby remove glitches in the low level direction of width up to the n clock cycles.

The count unit 20b includes: n stages of output signal delay elements 21 to which the output signal is inputted; the determination signal generation unit 22b which generates a determination signal indicating the presence/absence of removal of glitches by the glitch removal circuit 10; and the increment unit 23 which counts the number of times removing glitches, based on the determination signal generation unit 22b.

The determination signal generation unit 22b includes: a delay signal inverter 221 which inverts the signal outputted from the last stage of original signal delay elements 12; and a determination NOR circuit 223 to which the current output signal and signal outputted from all output signal delay elements 21 are inputted, and outputs the negative OR thereof.

The determination signal generation unit 22b outputs a determination signal which becomes a high level indicating having removed a glitch only in a case where the current output signal and the output signal of the past n times are low level, and the original signal of the previous n times being high level; and becomes low level in other cases.

According to the electronic device 1b of the third embodiment explained above, the following such effects are exerted in addition to the effects of the first embodiment explained previously.

In the electronic device 1b, the determination signal generation unit 22b generates a determination signal which has a value indicating having removed a glitch, in the case where the current output signal and the signals outputted from all of the output signal delay elements 21 are equal, and the current output signal and the signal outputted from the final stage of original signal delay elements 12 being different. It is thereby possible to accurately count the number of times glitches were removed.

In the electronic device 1b, the original signal delay element 12 is an element to which a signal having a possibility of including glitch noise in the high level direction while low level is inputted, and the output signal generation unit 13b outputs the logical product of the original signal and the signals outputted from each of the original signal delay elements 12. The output signal generation unit 13b thereby outputs the low level as the output signal in cases other than all of the outputs of n stages of original signal delay elements 12 and the original signal not being the high level. Therefore, the output signal generation unit 13b can appropriately remove a signal of high level which is not continuous for at least n+1 cycles included in the original signal as glitch noise.

Fourth Embodiment

Figure 5:
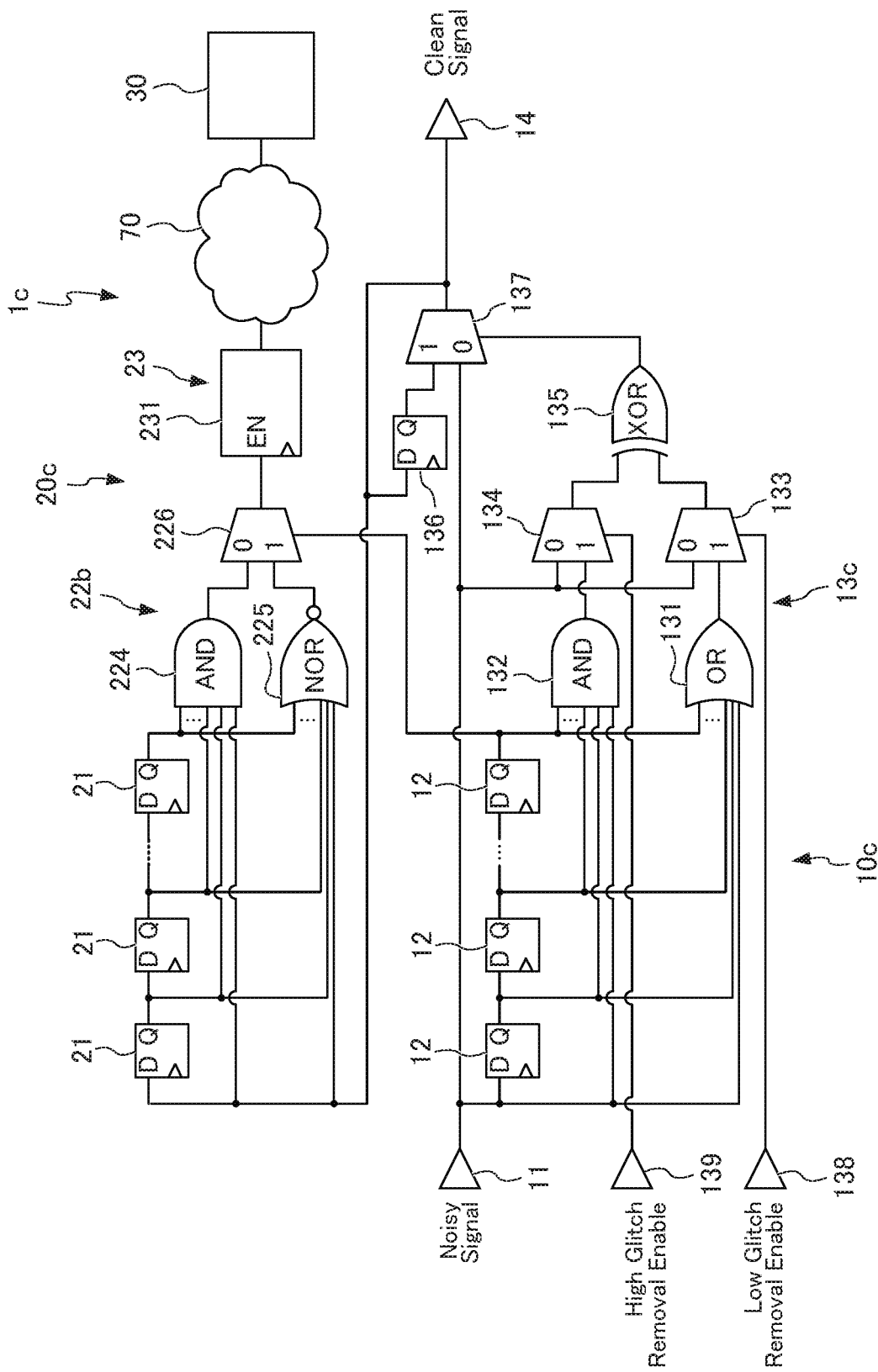
FIG. 5 is a circuit diagram showing an electronic device according to a fourth embodiment of the present embodiment.

FIG. 5 is a circuit diagram showing an electronic device 1c according to a fourth embodiment of the present disclosure. The electronic device 1c is a device which removes glitches in the high level direction appearing in the input signal of low level, and removes glitches in the low level direction appearing in an input signal of high level.

The electronic device 1c includes: a glitch removal circuit 10c which removes glitches from the inputted signal, a count unit 20c which counts the number of times that the glitch removal circuit 10c removed glitches, and the electronic device control unit 30 which performs control based on the count number of the count unit 20c.

The electronic device control unit 30 in the electronic device 1c according to the fourth embodiment is similar to the electronic device control unit 30 in the electronic device 1 according to the first embodiment.

The glitch removal circuit 10c includes: the signal input terminal 11, n stages (n is an integer of 1 or more) of original signal delay terminals 12, output signal generation unit 13c which generates an output signal, and a signal output terminal 14 which outputs the output signal.

The output signal generation unit 13c includes: an output generation OR circuit 131 which outputs the logical sum of the original signal and the output signals of all original signal delay terminals 12; an output generation AND circuit 132 which outputs the logical product of the original signal and output signals of all original signal delay terminals 12;

a first switch 133 which can disable the logical sum from the output generation OR circuit 131; a second switch 134 which can disable the logical product from the output generation AND circuit 132; an XOR circuit 135 which outputs an exclusive OR of the output of the first switch 133 and output of the second switch 134; an output latch delay element 136 which latches the output signal outputted by the output signal generation unit 13c; an output selector 137 which selects the original signal or output of the output latch delay element 136, and outputs as the output signal of the output signal generation unit 13c; a first selection terminal 138 to which the selection signal selecting whether or not to remove a glitch in the low level direction included in the original signal of the high level is inputted; and a second selection terminal 139 to which the selection signal selecting whether or not to remove a glitch in the high level direction included in the original signal of the low level is inputted.

The first switch 133 is a selector to which the output of the output generation OR circuit 131 and original signal are inputted and the selection signal from the first selection terminal 138 is inputted, and outputs the output of the output generation OR circuit 131 to the XOR circuit 135 in the case where the selection signal is high level; and disables the output of the output generation OR circuit 131 and outputs the original signal to the XOR circuit 135 in a case where the selection signal is low level. The second switch 134 is a selector to which the original signal and the output of the output generation AND circuit 132 are inputted, and the selection signal is inputted from the selection terminal 139, and outputs the output of the output generation AND circuit 132 to the XOR circuit 135 in a case where the selection signal being the high level; and disables the output of the output generation AND circuit 132 and outputs the original signal to the XOR circuit 135 in a case where the selection signal is the low level. The output of the XOR circuit 135 is inputted as the selection signal to the output selector 137. The output latch delay element 136, for example, is a D flip-flop, and stores the output signal of one time prior clock cycle. The output selector 137 outputs the output of the output latch delay element 136, i.e. signal of the same value of the previous time, as the output signal in a case where the output of the XOR circuit 135 is the high level; and outputs the original signal as the output signal in a case where the output of the XOR circuit 135 is the low level.

Regarding operation of the output signal generation unit 13c having such a configuration, firstly, behaviors when the signal of the high level is inputted to each of the first selection terminal 138 and second selection terminal 139 will be explained by cases.

(Case of Original Signal being High Level Signal Having Possibility of Including Glitch)

The output generation OR circuit 131 outputs the high level unless the original signal is low level, and all of the n stages of original signal delay elements 12 not latching the low level. The output generation OR circuit 131 thereby outputs the high level unless the low level continues n+1 times in the original signal. At this time, the output generation AND circuit 132 outputs the high level unless the original signal is the high level, and all of the n stages of original signal delay elements 12 are latching the high level. On the other hand, the output generation AND circuit 132 outputs the low level when part of the n stages of original signal delay elements 12 is latching the low level.

In the case where the output generation AND circuit 132 and output generation OR circuit 131 both output the high level, the XOR circuit 135 outputs the low level to the output selector 137. On the other hand, in the case where the output generation AND circuit 132 outputs the low level, the XOR circuit 135 outputs the high level to the output selector 137.

In the case where the low level is outputted from the XOR circuit 135, the output selector 137 outputs the high level, which is the original signal, to the signal output terminal 14. On the other hand, in the case where the high level is outputted from the XOR circuit 135, the high level, which is the output of the output selector 137 of one prior clock latching to the output latch delay element 136, is outputted. It is thereby possible to remove glitches in the low level direction included in the high level signal.

(Case of Original Signal being Low Level Signal Having Possibility of Including Glitch)

The output generation OR circuit 131 outputs the low level unless the original signal is the high level, or any of the n stages of original signal delay elements 12 are latching the high level. At this time, the output generation AND circuit 132 outputs the high level unless the original signal is the low level, and all of the n stages of original signal delay elements 12 are latching the low level. The output generation AND circuit 132 thereby outputs the low level unless the high level continues for n+1 times in the original signal.

In the case where the output generation AND circuit 132 and output generation OR circuit 131 both output the low level, the XOR circuit 135 outputs the low level to the output selector 137. On the other hand, in the case where the output generation OR circuit 131 outputs the high level, the XOR circuit 135 outputs the high level to the output selector 137.

In the case where the low level is outputted from the XOR circuit 135, the output selector 137 outputs the high level which is the original signal to the signal output terminal 14. On the other hand, in the case where the high level os outputted from the XOR circuit 135, the high level which is the output of the output selector 137 of one prior clock latching to the output latch delay element 136 is outputted. It is thereby possible to remove glitches in the high level direction included in a low level signal.

In the above way, the glitch removal circuit 10c can remove both glitches in the high level direction and glitches in the low level direction.

Next, operation when a signal of low level is inputted to at least any of the first selection terminal 138 and second selection terminal 139 will be explained.

In the case where the selection signal inputted to the first switch 133 from the first selection terminal 138 is the low level, and the selection signal inputted to the second switch 134 from the second selection terminal 139 being the high level, the logical sum of the output generation OR circuit 131 becomes disabled, and the logical product of the output generation AND circuit 132 becomes enabled. In this case, the glitch removal circuit 10c in FIG. 5 becomes equivalent to the glitch removal circuit 10a in FIG. 2, and thus removes the glitch in the low level direction included in the original signal of the high level, similarly to the glitch removal circuit 10a in FIG. 2.

In the case where the selection signal inputted to the first switch 133 from the first selection terminal 138 is the high level, and the selection signal inputted to the second switch 134 from the second selection terminal 139 being the low level, the logical sum of the output generation OR circuit 131 is enabled, and the logical product of the output generation AND circuit 132 is disabled. In this case, the glitch removal circuit 10c in FIG. 5, due to being equivalent to the glitch removal circuit 10b in FIG. 4, removes a glitch in the high level direction included in the original signal of the low level similarly to the glitch removal circuit 10b in FIG. 4.

In the case where the selection signal inputted to the first switch 133 from the first selection terminal 139 is the low level, and the selection signal inputted to the second switch 134 from the second selection terminal 139 being the low level, the logical sum of the output generation OR circuit 131 and the logical product of the output generation AND circuit 132 are both disabled. In this case, the glitch removal circuit 10c in FIG. 5 always outputs the original signal as is as the output signal.

In the above way, with the electronic device 1c in FIG. 5, the four operations modes can be selected according to the settings of the first switch 133 and second switch 134 in the one glitch removal circuit 10a.

The count unit 20c includes: n stages of output signal delay elements 21 to which output signal is inputted; the determination signal generation unit 22c which generates the determination signal indicating the presence/absence of removal of glitches by the glitch removal circuit 10; and the increment unit 23 which counts the number of times removing glitches, based on the determination signal generation unit 22c. It should be noted that the output latch delay element 136 may also serve as the first stage of the output signal delay element 21.

The determination signal generation unit 22c includes: the determination AND circuit 224 to which the current output signal and the signal outputted from all of the output signal delay elements 21 are inputted, and outputs the logical product; the NOR circuit 225 to which the current output signal and the signal outputted from all of the output signal delay elements 21 are inputted, and outputs negative OR; and the selector 226 which selects and outputs the output of the determination AND circuit 224 or the output of the NOR circuit 225. The selector 226 outputs, to the increment unit 23, the output of the NOR circuit in the case where the output of the last stage of the original signal delay elements 12 of the glitch removal circuit 10c is inputted as the selection signal, and this selection signal being the high level; and outputs, to the increment unit 23, the output of the AND circuit in the case where the selection signal is the low level.

The determination signal generation unit 22c thereby generates a determination signal which has a value indicating an event of having removed a glitch, in a case where the current output signal and the signal outputted from all of the output signal delay elements 21 are equal, and the current output signal and signal outputted from the last stage of the original signal delay elements 12 differing.

According to the electronic device 1c of the fourth embodiment explained above, the following such effects are exerted in addition to the effects of the first embodiment previously explained.

In the electronic device 1c, the determination signal generation unit 22c generates a determination signal which has a value indicating an event of removing a glitch, in a case where the current output signal and the signal outputted from all of the output signal delay elements 21 are equal, and the current output signal and the signal outputted from the last stage of the original signal delay elements 12 differing. It is thereby possible to accurately count the number of times glitches are removed.

In the electronic device 1c, the original signal delay element 12 is an element to which a signal having a possibility of including glitch noise in the low level direction when high level, and having a possibility of including glitch noise in the high level direction when low level is inputted, and the output signal generation unit 13 generates the output signal, based on the exclusive OR relative to each of the logical sum and logical product of the original signal and the signal outputted from each of the original signal delay elements 12. It is thereby possible to remove glitches even if the original signal is a high level signal. In addition, by comparing the signal outputted to the signal output terminal 14 and the output of the last stage of the original signal delay element 12, it is possible to count the number of times removing glitches. Therefore, the electronic device 1c has high versatility.

In the electronic device 1c, the output signal generation unit 13c further includes: the first switch 133 which enables the logical sum, and the second switch 134 which enables the logical product. It is thereby possible to selectively remove glitches from the original signal. Therefore, the electronic device 1c has high versatility.

Fifth Embodiment

Figure 6:
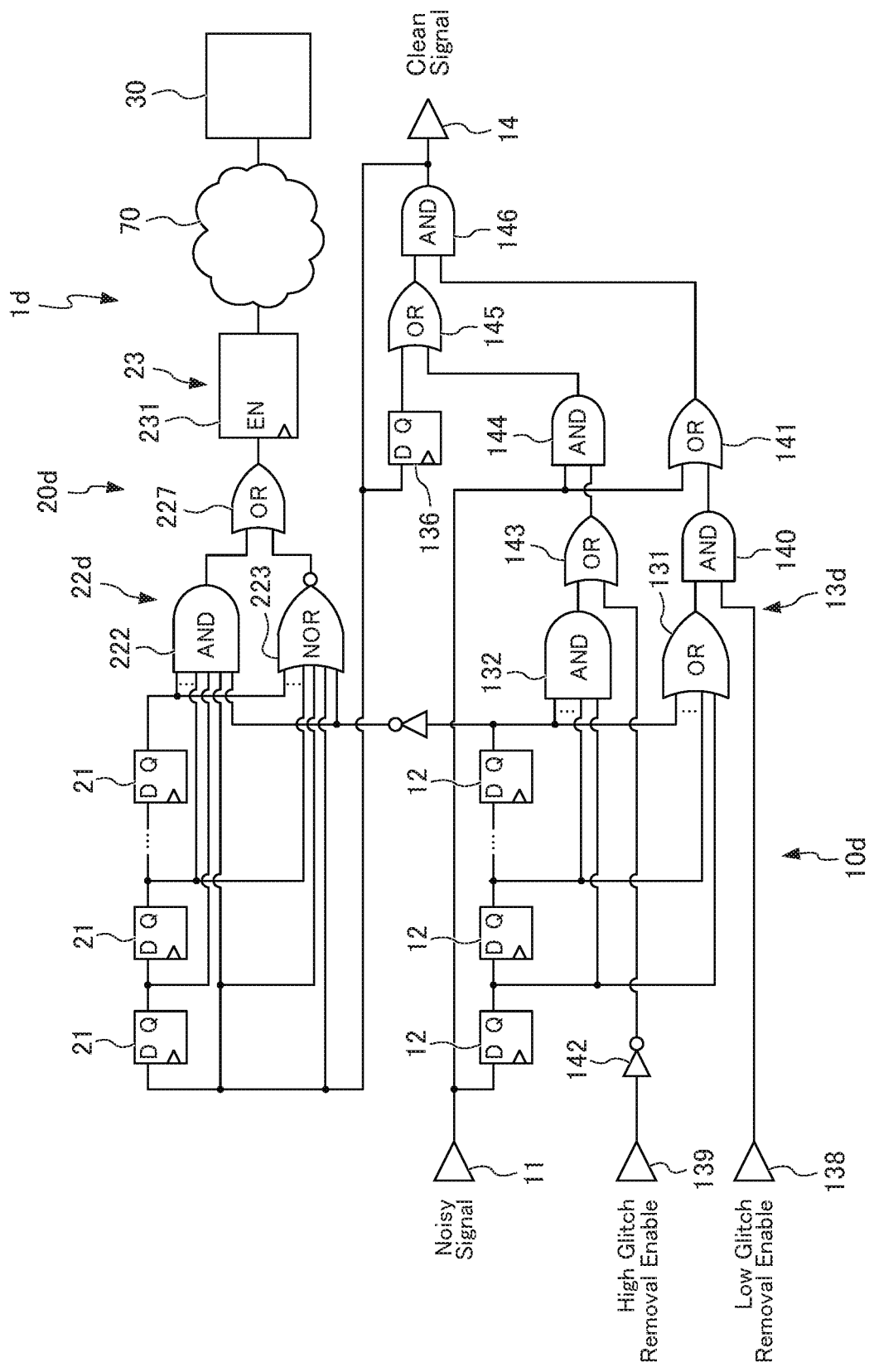
FIG. 6 is a circuit diagram showing an electronic device according to a fifth embodiment of the present disclosure.

FIG. 6 is a circuit diagram showing an electronic device 1d according to a fifth embodiment of the present disclosure. The electronic device 1d according to the present embodiment is a device which removes glitches in the high level direction appearing in an input signal of low level, and removes glitches in the low level direction appearing in the input signal of high level.

The electronic device 1d includes: a glitch removal circuit 10d which removes glitches from the inputted signal; a count unit 20d which counts the number of times that the glitch removal circuit 10d removed glitches; and the electronic device control unit 30 which performs control based on the count number of the count unit 20d.

The electronic device control unit 30 of the electronic device 1d according to the fifth embodiment is similar to the electronic device control unit 30 of the electronic device 1 according to the first embodiment.

The glitch removal circuit 10d includes the signal input terminal 11, n stages (n is an integer of 1 or more) of original signal delay elements 12, an output signal generation unit 13d which generates an output signal, and a signal output terminal 14 which outputs the output signal.

The output signal generation unit 13d includes: the output generation OR circuit 131 which outputs the logical sum of the original signal and the output signals of all original signal delay terminals 12; the output generation AND circuit 132 which outputs the logical product of the original signal and output signals of all original signal delay terminals 12; the first selection terminal 138 to which the selection signal selecting whether or not to remove a glitch in the low level direction included in the original signal of the high level is inputted; the second selection terminal 139 to which the selection signal selecting whether or not to remove a glitch in the high level direction included in the original signal of the low level is inputted; a first selection AND circuit 140 which outputs the logical product of the output of the output generation OR circuit 131 and the selection signal inputted from the first selection terminal 138; a first selection OR circuit 141 which outputs the logical sum of the output of the first selection AND circuit 140 and the original signal; a selection signal inverter 142 which inverts the selection signal inputted from the first selection terminal 138; a second selection OR circuit 143 which outputs the logical sum of the output of the output generation AND circuit 132 and the output of the selection signal inverter 142; a second selection AND circuit 144 which outputs the logical product of the output of the second selection OR circuit 143 and the original signal; the output latch delay element 136 which latches the output signal; an output OR circuit 145 which outputs the logical sum of the output of the second selection OR circuit 143 and the output of the output latch delay element 136; and an output AND circuit 146 which outputs the logical product of the output of the output OR circuit 145 and the output of the first selection OR circuit 141.

The first selection AND circuit 140 outputs as is the output of the output generation OR circuit 131 in a case where the selection signal inputted from the first selection terminal 138 is the high level, and outputs the signal of the low level irrespective of the output of the output generation OR circuit 131 in a case where the selection signal inputted from the first selection terminal 138 is the low level. The output of the output generation OR circuit 131 always becomes the high level in the case where the original signal is the high level. For this reason, the output of the first selection OR circuit 141 becomes the original signal (output disabling the logical sum by the output generation OR circuit 131) or the output of the output generation OR circuit 131 (output enabling the logical sum by the output generation OR circuit 131).

The second selection OR circuit 143 outputs as is the output of the output generation AND circuit 132 in a case where the selection signal inputted from the second selection terminal 139 is the high level; and outputs a signal of high level irrespective of the output of the output generation AND circuit 132, in a case where the selection signal inputted from the second selection terminal 139 is the low level. The output of the output generation AND circuit 132 always becomes the low level in a case where the original signal is the low level. For this reason, the output of the second selection AND circuit 144 becomes the original signal (output disabling the logical product by the output generation AND circuit 132), or the output of the output generation AND circuit 132 (output enabling the logical product by the output generation AND circuit 132).

The output latch delay element 136 stores the output signal of one prior clock cycle. The output of the output OR circuit 145 becomes the high level in a case where the output signal of one time prior is the high level, and a case where the output of the second selection AND circuit 144 is the high level. The output of the output AND circuit 146 becomes the high level in the case where the output of the output OR circuit 145 and the output of the first selection OR circuit 141 both are the high level. When directly inputting the output of the first selection OR circuit 141 (output of the output generation OR circuit 131) and the output of the second selection AND circuit 144 (output of the output generation AND circuit 132) to the output AND circuit 146, a signal including low level direction among the signals of high level is outputted. However, since the output signal generation unit 13 has the output latch delay element 136 and output OR circuit 145, the output signal temporarily becomes the high level, the output OR circuit 145 outputs a signal of the high level at the next time of the output of the first selection OR circuit 141 being the high level, even if the output of the second selection AND circuit 144 is the low level. The output of the output AND circuit 146 thereby becomes a signal from which a glitch in the low level direction and a glitch in the high level direction have been removed from the original signal.

The count unit 20d includes n stages of the output signal delay elements 21 to which the output signal is inputted; the determination signal generation unit 22d which generates a determination signal indicating the presence/absence of removal of a glitch by the glitch removal circuit 10; and the increment unit 23 which counts the number of times removing glitches based on the determination signal generation unit 22d.

The determination signal generation unit 22d has a delay signal inverter 22a which inverts the signal outputted from the last stage of original signal delay elements 12; the determination AND circuit 222 to which the current output signal and the signal outputted from all of the output signal delay elements 21 are inputted and outputs the logical product of these; the determination NOR circuit 223 to which signals outputted from all of the output signal delay elements 21 are inputted, and outputs the negative OR of these; and the determination OR circuit 227 which outputs the logical sum of the output of the determination AND circuit 222 and the determination NOR circuit 223.

The output of the determination AND circuit 222 becomes the high level when the glitch removal circuit 10d removes a glitch in the low level direction among the original signals of the high level. The output of the determination NOR circuit 223 becomes the high level when the glitch removal circuit 10d removes a glitch in the high level direction among the original signals of the low level. For this reason, the output of the determination NOR circuit 223 becomes the high level when the glitch removal circuit 10d removes a glitch in either direction.

The electronic device 1d of the fifth embodiment explained above also exerts the same effects as the electronic device 1c of the fourth embodiment explained previously.

Sixth Embodiment

Figure 7:
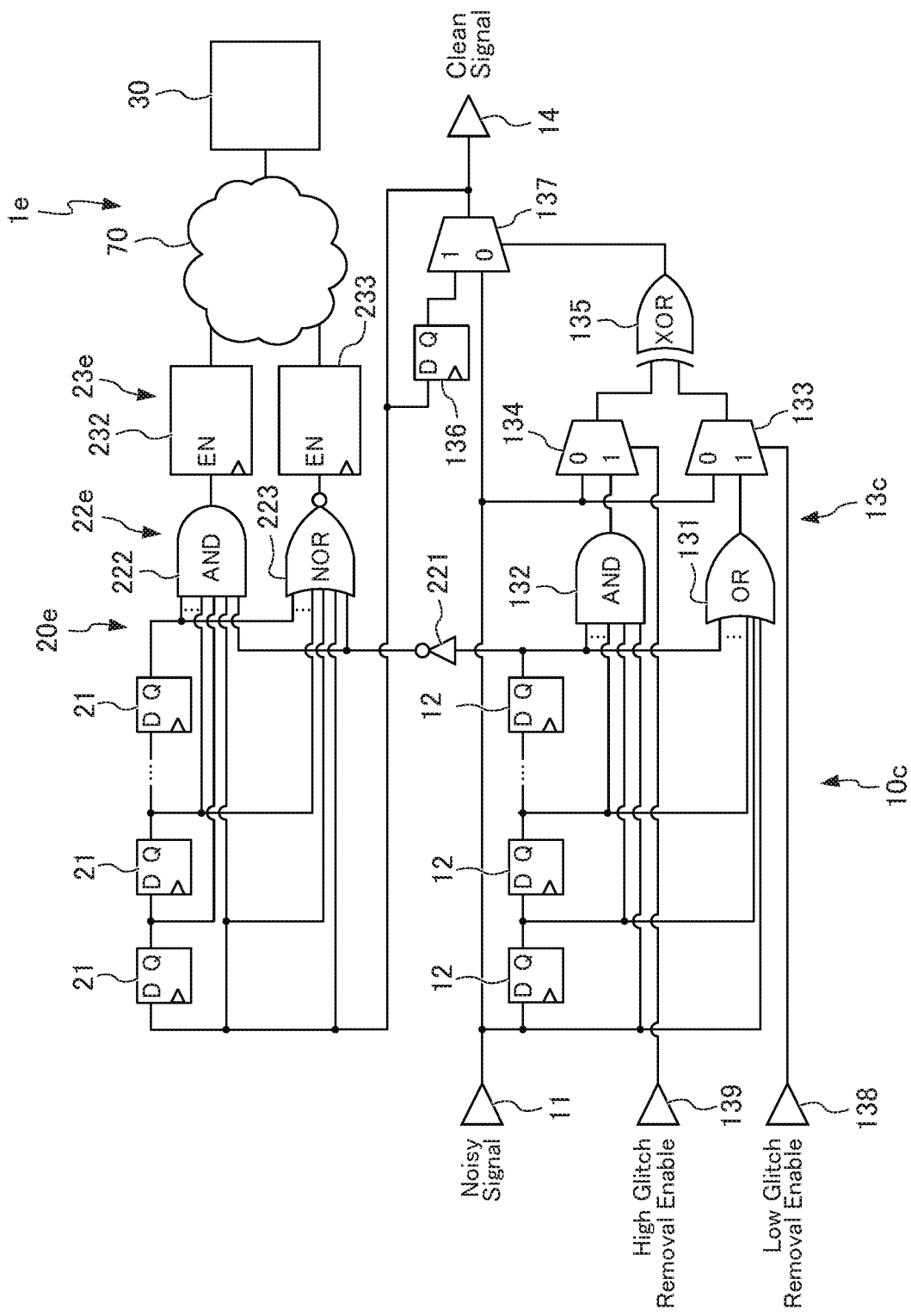
FIG. 7 is a circuit diagram showing an electronic device according to a sixth embodiment of the present disclosure.

FIG. 7 is a circuit diagram showing an electronic device 1e according to a sixth embodiment of the present disclosure. The electronic device 1e of the present embodiment is a device which removes a glitch in the high level direction appearing in the input signal of low level, and removes a glitch in the low level direction appearing in the input signal of high level.

The electronic device 1e includes: the glitch removal circuit 10c which removes glitches in the inputted signals; a count unit 20e which counts the number of times that the glitch removal circuit 10c removes glitches; and the electronic device control unit 30 which performs control based on the count number of the count unit 20e.

The glitch removal circuit 10c of the electronic device 1e according to the sixth embodiment is similar to the glitch removal circuit 10c of the electronic device 1c according to the fourth embodiment. The electronic device control unit 30 of the electronic device 1e according to the sixth embodiment is similar to the electronic device control unit 30 of the electronic device 1 according to the first embodiment.

The count unit 20e includes: n stages of the output signal delay elements 21 to which the output signal is inputted; a determination signal generation unit 22e which generates a determination signal indicating the presence/absence of removal of glitches by the glitch removal circuit 10; and an increment unit 23e which counts the number of times removing glitches, based on the determination signal generation unit 22e.

The determination signal generation unit 22e has the delay signal inverter 221 which inverts the signal outputted from the last stage of the original signal delay elements 12; the determination AND circuit 222 to which the output of the delay signal inverter 221, current output signal, and signals outputted from all of the output signal delay elements 21 are inputted, and outputs the logical product of these; and the determination NOR circuit 223 to which signals outputted from all of the output signal delay elements 21 are inputted and outputs the negative OR of these. The determination signal generation unit 22e outputs the output of the determination AND circuit 222 to the increment unit 23e as a first determination signal, and outputs the output of the determination NOR circuit 223 to the increment unit 23e as a second determination signal.

The increment unit 23e has a first incrementer 232 which increments the number of times removing glitches every time the first determination signal outputted by the determination AND circuit 222 is the high level; and a second incrementer 233 which increments the number of times removing glitches every time the second determination signal outputted by the determination NOR circuit 223 is the high level. In other words, the increment unit 23e counts the number of times that the glitch removal circuit 10c removed glitches in the low level direction among the original signal of high level by the first incrementer 232, and counts the number of times that the glitch removal circuit 10c removed glitches in the high level direction among the original signals of low level by the second incrementer 233.

The electronic device 1e of the sixth embodiment explained above can grasp in more detail the occurrence status of glitches, due to separately counting the number of times removing glitches in the low level direction, and the number of times removing glitches in the high level direction, by the increment unit 23e.

Seventh Embodiment

Figure 8:
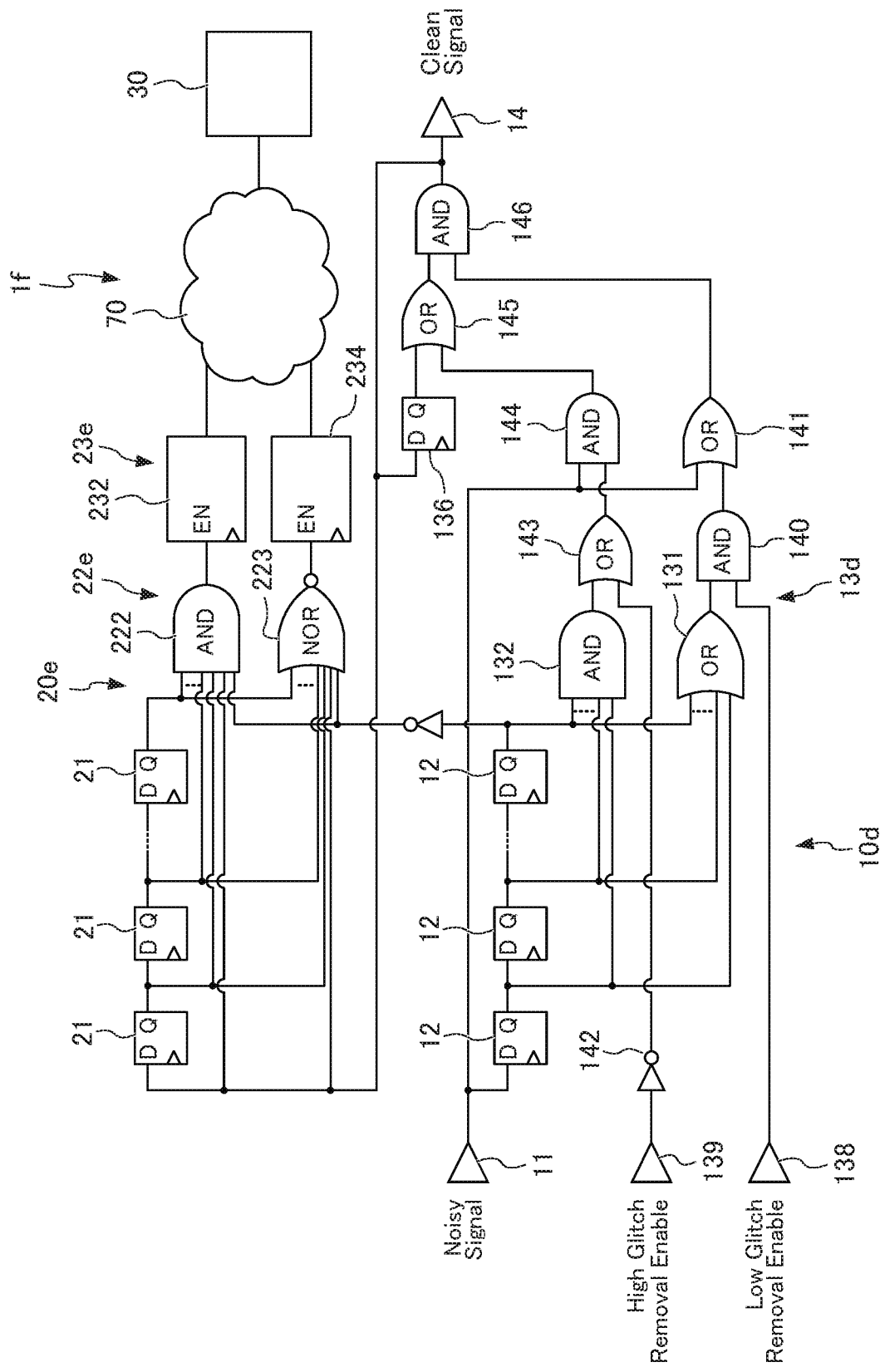
FIG. 8 is a circuit diagram showing an electronic device according to a seventh embodiment of the present disclosure.

FIG. 8 is a circuit diagram showing an electronic device 1f according to a seventh embodiment of the present disclosure. The electronic device 1f of the present embodiment is a device which removes glitches in the high level direction appearing in the input signal of low level, and removes glitches in the low level appearing in the input of high level.

The electronic device 1f includes: a glitch removal circuit 10d which removes glitches in the inputted signal; a count unit 20e which counts the number of times that the glitch removal circuit 10d removed glitches; and the electronic device control unit 30 which performs control based on the count number of the count unit 20e.

The glitch removal circuit 10d in the electronic device 1f of the present embodiment is the same as the glitch removal circuit 10d in the electronic device 1d of the fifth embodiment. In addition, the count unit 20e in the electronic device 1f of the present embodiment is the same as the count unit 20e in the electronic device 1e of the sixth embodiment.

The electronic device 1f of this seventh embodiment can also grasp the occurrence status of glitches in more detail due to separately counting the number of times removing glitches in the low level direction, and the number of times removing glitches in the high level direction, by the increment unit 23e.

(Initialization Circuit)

Figure 9:
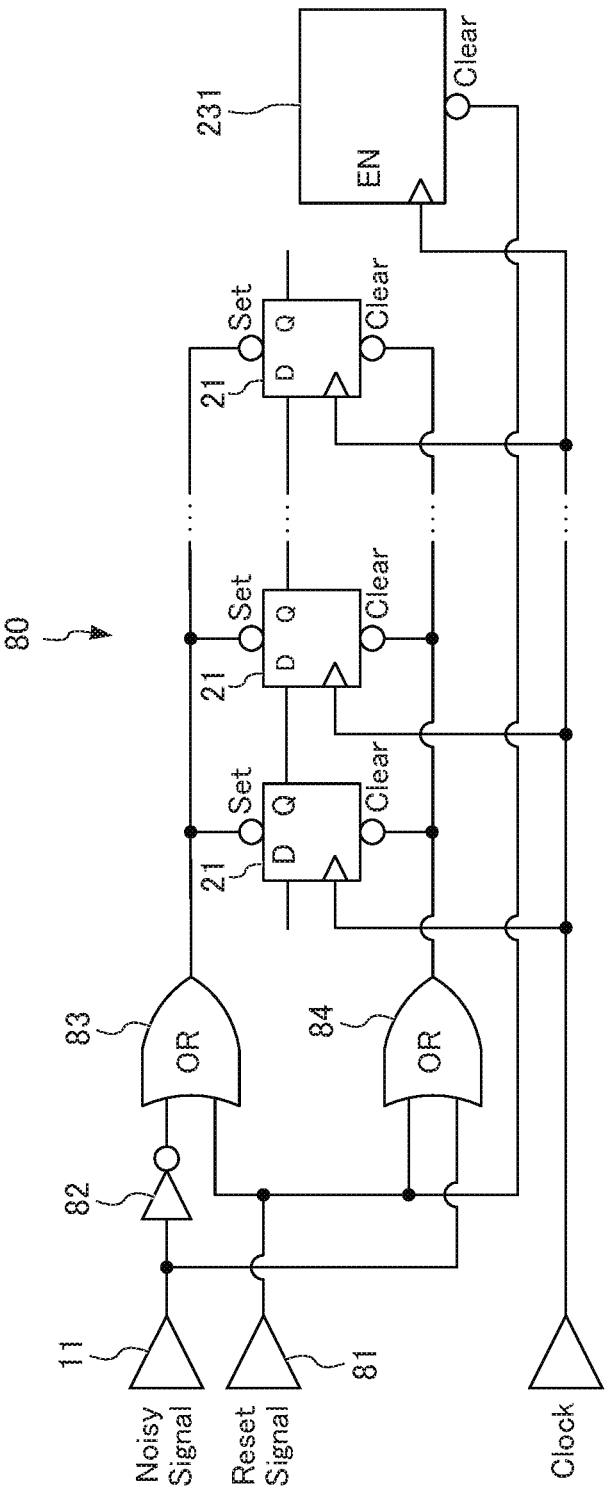
FIG. 9 is a circuit diagram showing an initialization circuit which can be added to the electronic devices according to the first to fifth embodiments of the present embodiment.

FIG. 9 is a circuit diagram showing an initialization circuit 80 which can be added to the electronic devices 1a to 1f of the first to seventh embodiments of the present disclosure. The electronic devices made by adding the initialization circuit 80 to the electronic devices 1a to 1f of the first to seventh embodiments are separate embodiments of the present disclosure.

The initialization circuit 80 includes: a reset terminal 81 to which a reset signal that is a negative logic signal which becomes low level only when initializing the count of the number of times removing glitches at normally high level is inputted; an original signal inverter 82 which inverts the original signal; a first initialization OR circuit 83 which outputs the logical sum of the output of the original signal inverter 82 and reset signal inputted from the reset terminal 81; and a second initialization OR circuit 84 which outputs the logical sum of the original signal and reset signal inputted from the reset terminal 81.

The reset signal inputted to the reset terminal 81 is also inputted to a clear terminal of the incrementer 231, in addition to the first initialization OR circuit 83 and second initialization OR circuit 84. The output of the first initialization OR circuit 83 is inputted to a preset terminal setting a retention value of each output signal delay element 21 to the high level. On the other hand, the output of the second initialization OR circuit 84 is inputted to the clear terminal setting the retention value of each output signal delay elements 21 to the low level. This clear terminal and preset terminal all shall be negative logic. For this reason, with the incrementer 231, the count is reset (initial setting) to zero when the reset signal inputted to the reset terminal 81 becomes the low level. With the output signal delay element 21, the retention value is set to the high level when the output of the first initialization OR circuit 83 becomes the low level, and the retention value is set to the low level when the output of the second initialization OR circuit 84 becomes the low level.

The output of the first initialization OR circuit 83 becomes the low level only when the original signal is the high level, and the reset signal inputted from the reset terminal 81 is the low level. The output of the second initialization OR circuit 84 becomes the low level only when the original signal is the low level, and the reset signal inputted from the reset terminal 81 is the low level. For this reason, in the case where the original signal is the high level when the reset signal becomes the low level, the retention value of each output signal delay element 21 is initially set to the high level. In addition, in the case where the original signal is the low level when the reset signal becomes the low level, the retention value of each output signal delay element 21 is initially set to the low level.

Eighth Embodiment

Figure 10:
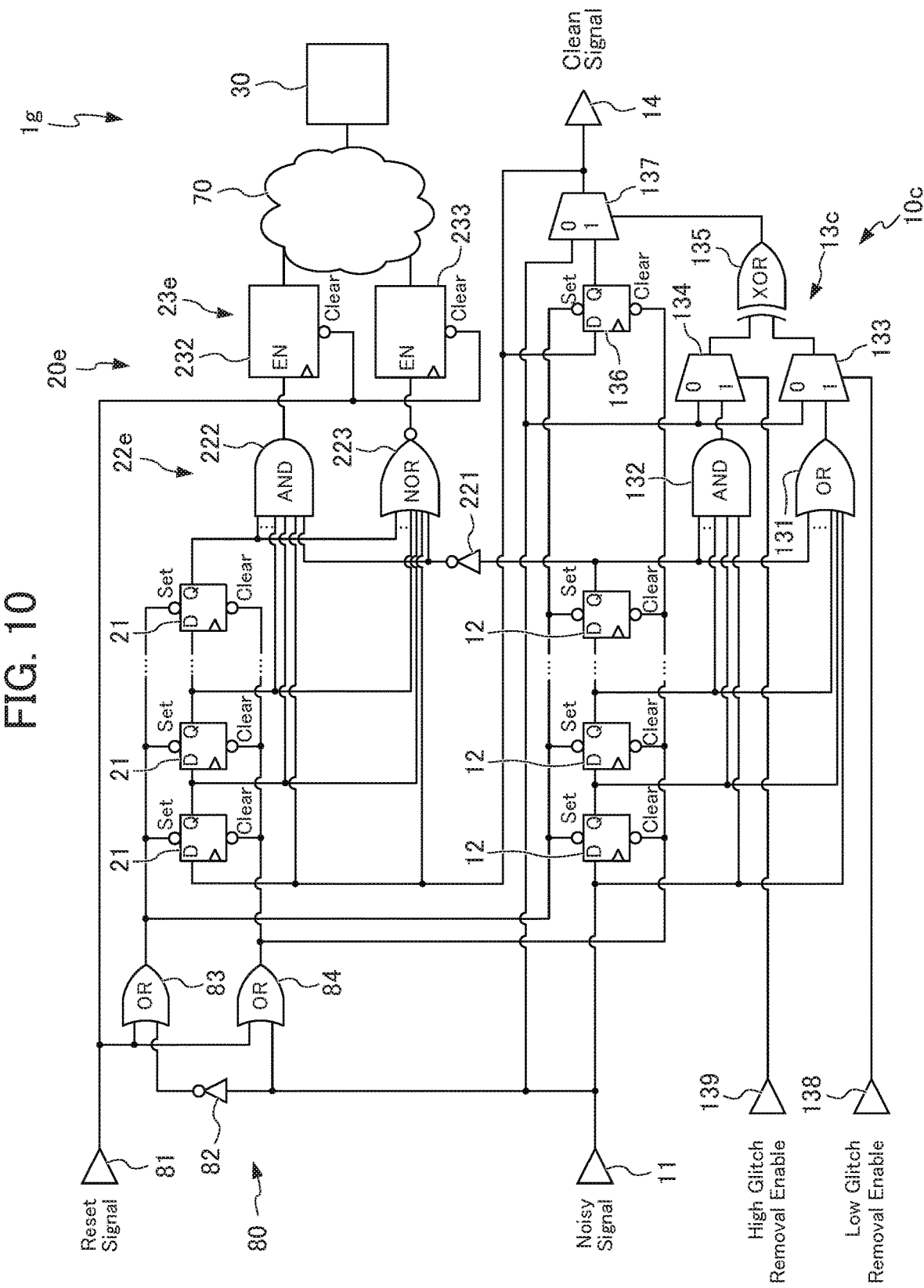
FIG. 10 is a circuit diagram showing an electronic device according to an eighth embodiment of the present disclosure.

FIG. 10 is a circuit diagram showing an electronic device 1g according to an eighth embodiment of the present disclosure. The electronic device 1g of the present embodiment is a device made by adding the initialization circuit 80 in FIG. 9 to the electronic device 1e of the sixth embodiment of the present disclosure.

In the electronic device 1g, the reset signal inputted to the reset terminal 81 is inputted to the first initialization OR circuit 83 and second initialization OR circuit 84, and inverted and inputted to the clear terminal of the first incrementer 232 and second incrementer 233. The output of the first initialization OR circuit 83 is inverted and inputted to the preset terminal of each output signal delay element 21, preset terminal of each original signal delay element 12, and preset terminal of the output latch delay element 136. The output of the second initialization OR circuit 84 is inverted and inputted to the clear terminal of each output signal delay element 21, clear terminal of each original signal delay element 12, and the clear terminal of the output latch delay element 136, respectively.

According to the electronic device 1g of the eighth embodiment explained above, the following such effects are exerted in addition to the effects of the first and sixth embodiment previously explained.

The electronic device 1g includes an initialization circuit 80 which initializes the original signal delay element 12, output signal delay element 21 and increment unit 23e (incrementers 231, 232), in a case where the reset signal is inputted. The electronic device 1g can thereby initialize the glitch removal circuit 10c and count unit 20e. For this reason, it is possible to grasp the occurrence status of glitches in more detail.

Ninth Embodiment

Figure 11:
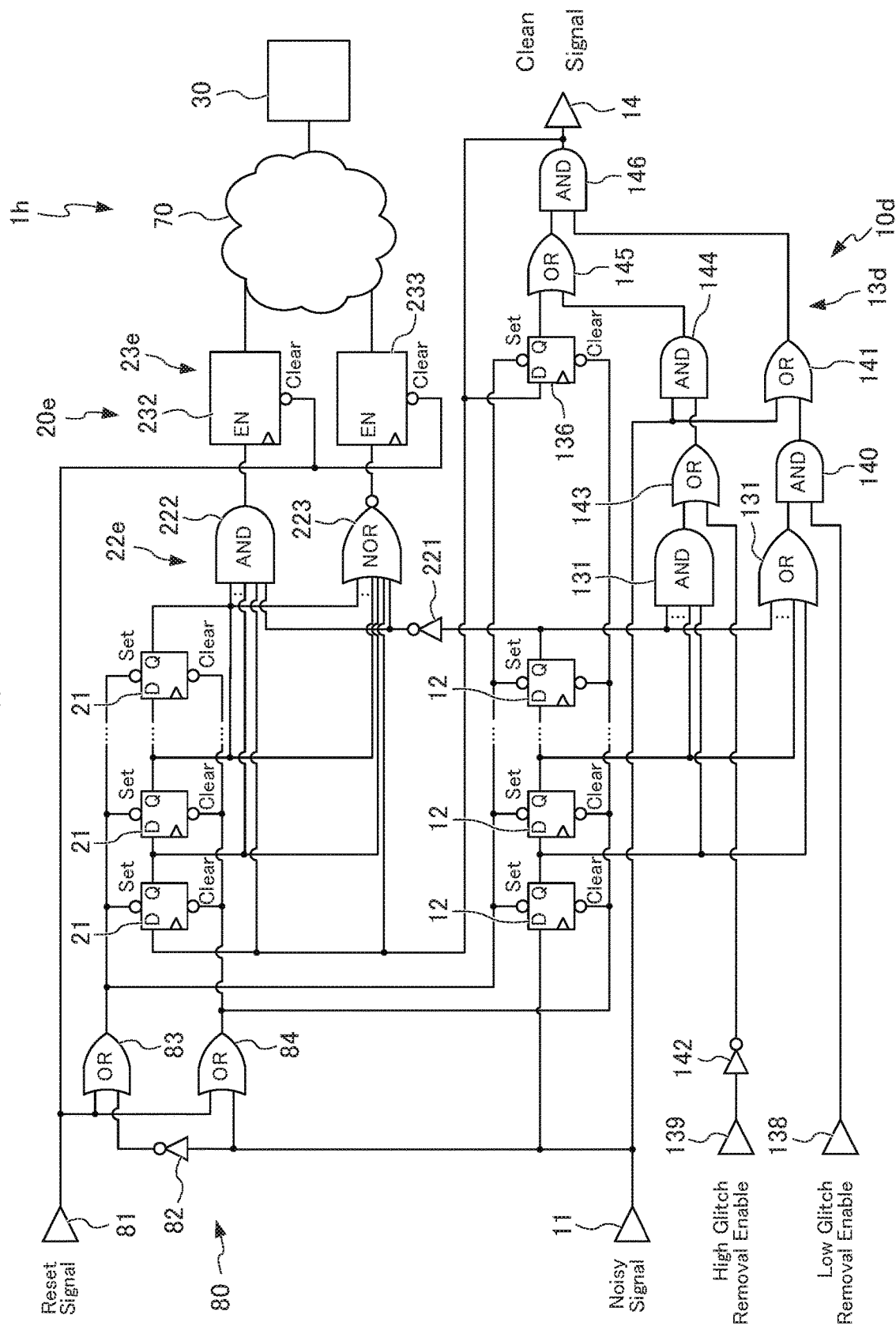
FIG. 11 is a circuit diagram showing an electronic device according to a ninth embodiment of the present disclosure.

FIG. 11 is a circuit diagram showing an electronic device 1h according to a ninth embodiment of the present disclosure. The electronic device 1h of the present embodiment is a device made by adding the initialization circuit 80 of FIG. 9 to the electronic device 1f of the seventh embodiment of the present disclosure.

In the electronic device 1h, the reset signal inputted to the reset terminal 81 is inputted to the first initialization OR circuit 83 and the second initialization OR circuit 84, and inverted and inputted to the clear terminal of the first incrementer 232 and second incrementer 233. The output of the first initialization OR circuit 83 is inverted and inputted to each of the preset terminal of each output signal delay element 21, preset terminal of each original signal delay element 12, and preset terminal of the output latch delay element 136. The output of the second initialization OR circuit 84 is inverted and inputted to each of the clear terminal of each output signal delay element 21, clear terminal of each original signal delay element 12, and clear terminal of the output latch delay element 136.

Also according to the electronic device 1h of the ninth embodiment explained above, the electronic device 1h can initialize the glitch removal circuit 10d and count unit 20e. For this reason, it is possible to grasp the occurrence status of glitches in more detail.

Tenth Embodiment

Figure 12:
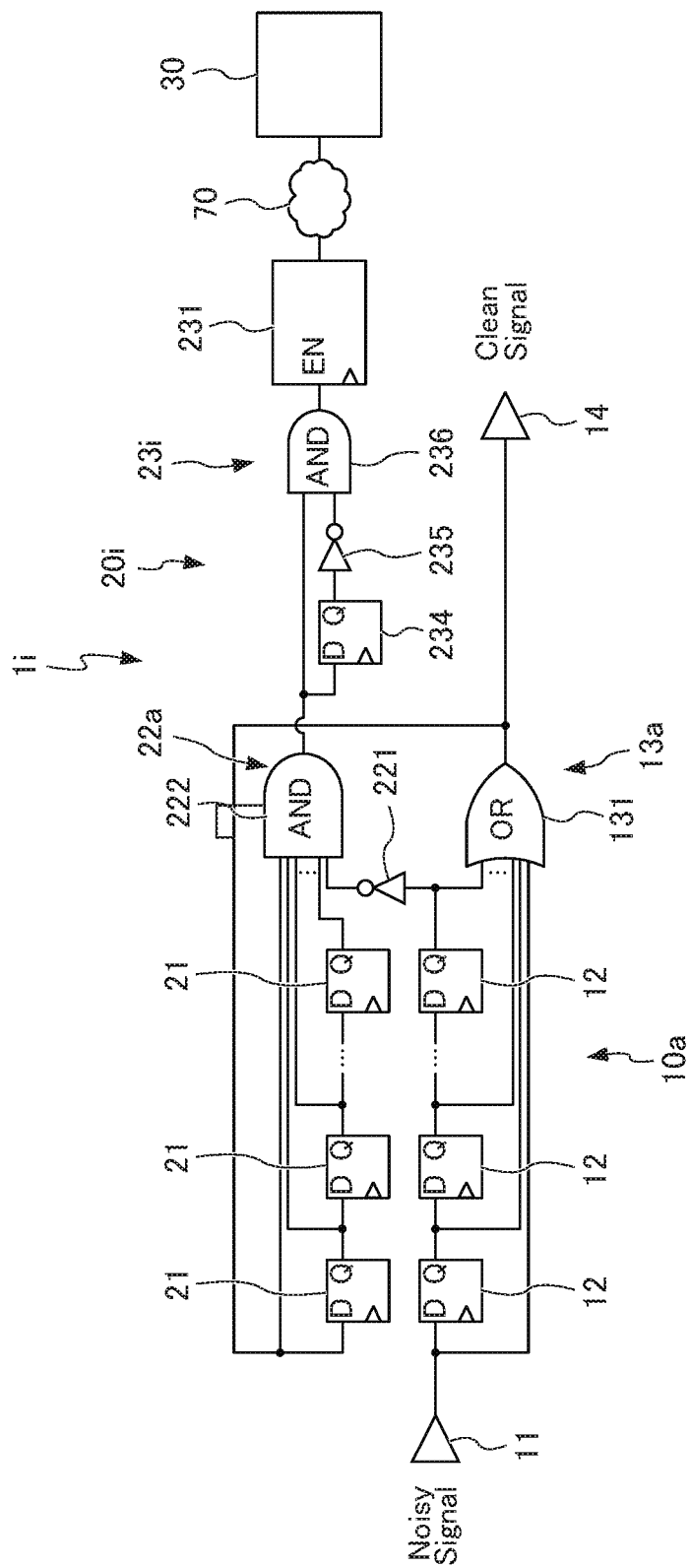
FIG. 12 is a circuit diagram showing an electronic device according to a tenth embodiment of the present disclosure.

FIG. 12 is a circuit diagram showing an electronic device 1i according to a tenth embodiment of the present disclosure. The electronic device 1i of the present embodiment is a device which removes glitches in the low level direction appearing in the input signal of high level.

The electronic device 1i of the present embodiment includes: the glitch removal circuit 10a which removes glitches from the inputted signal; a count unit 20i which counts a number of times that the glitch removal circuit 10a removed glitches; and the electronic device control unit 30 which performs control based on the count number of the count unit 20i.

The glitch removal circuit 10a in the electronic device 1i of the present embodiment is the same as the glitch removal circuit 10a in the electronic device 1a of the second embodiment. In addition, the electronic device control unit 30 in the electronic device 1i according to the present embodiment is the same as the electronic device control unit 30 in the electronic device 1 according to the first embodiment.

The count unit 20i includes: n stages of the output signal delay elements 21 to which the output signal is inputted; the determination signal generation unit 22a which generates a determination signal indicating the presence/absence of removal of glitches by the glitch removal circuit 10; and an increment unit 23i which counts the number of times removing glitches based on the determination signal generation unit 22. In the electronic device 1i of the present embodiment, only the configuration of the increment unit 23i differs from the electronic device 1a of the second embodiment.

The increment unit 23i includes: the determination signal delay element 234 which latches the determination signal outputted by the determination signal generation unit 22a; the determination signal inversion element 235 which inverts the output of the determination signal delay element 234; the increment AND circuit 236 which outputs the logical product of the determination signal outputted by the determination signal generation unit 22a and the output of the determination signal inversion element 235; and the incrementer 231 which increments the count every time the output of the increment AND circuit 236 becomes the high level.

The increment unit 23i increments the incrementer 231 only in the case where the current determination signal is the high level and the previous determination signal being the low level. For this reason, the increment unit 23i increments the incrementer by one time, in a case where the glitch removal circuit 10a removes a glitch continuously over a plurality of times of the clock cycle. In other words, the count unit 20i counts the asserting edge of glitches removed by the glitch removal circuit 10a.

According to the electronic device 1i of the tenth embodiment explained above, the following such effects are exerted in addition to the effects of the first embodiment previously explained.

In a case where the time band of the glitch removed by the glitch removal circuit 10a is at least two clock cycles, the electronic device 1i counts the number of times removing this glitch by the count unit 20i as one time. For this reason, it is possible to grasp the occurrence status of glitches in more detail.

Eleventh Embodiment

Figure 13:
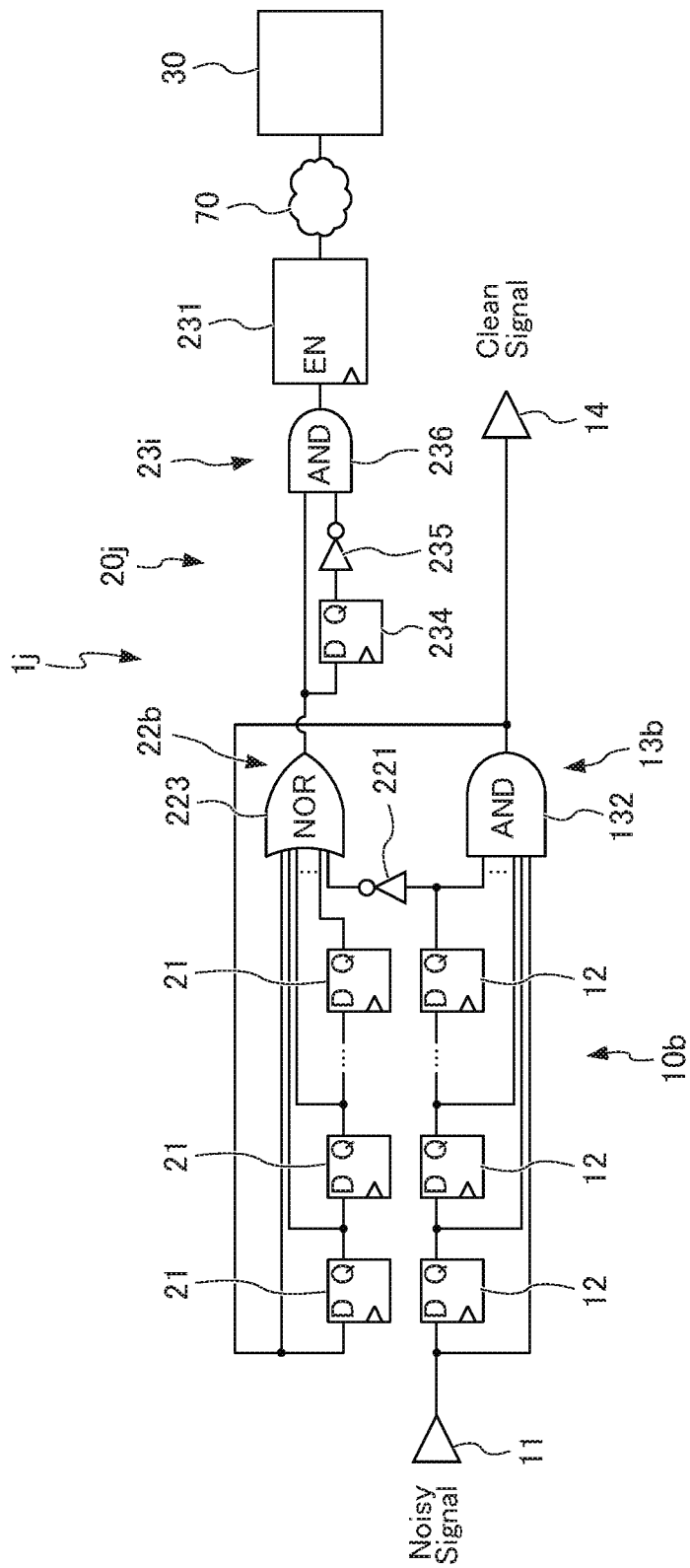
FIG. 13 is a circuit diagram showing an electronic device according to an eleventh embodiment of the present disclosure.

FIG. 13 is a circuit diagram showing an electronic device 1j according to an eleventh embodiment of the present disclosure. The electronic device 1j of the present embodiment is a device which removes glitches in the high level direction appearing in the input signal of low level.

The electronic device 1j of the present embodiment includes: the glitch removal circuit 10b which removes glitches from the inputted signal; a count unit 20j which counts a number of times that the glitch removal circuit 10b removed glitches; and the electronic device control unit 30 which performs control based on the count number of the count unit 20j.

The count unit 20j includes: n stages of the output signal delay element 21 to which the output signal is inputted; the determination signal generation unit 22a which generates the determination signal indicating the presence/absence of removal of glitches by the glitch removal circuit 10; and an increment unit 23i which counts the number of times removing glitches, based on the determination signal generation unit 22. The electronic device 1j of the present embodiment is a device made by replacing the increment unit 23 in the electronic device 1b of the third embodiment with the increment unit 23i in the electronic device 1i of the tenth embodiment.

According to the electronic device 1j of this eleventh embodiment, it is possible to count the asserting edge of glitches in the high level direction removed, and accurately grasp the occurrence status of glitches in the high level direction.

(Initialization Circuit)

Figure 14:
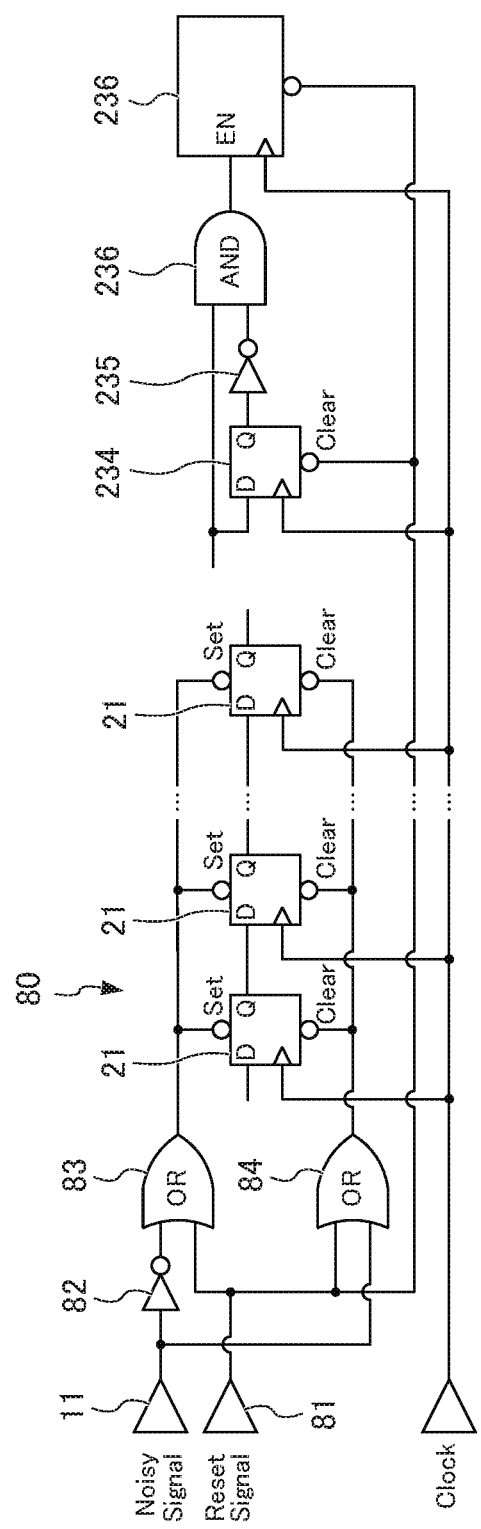
FIG. 14 is a circuit diagram showing the wiring upon adding the initialization circuit to the electronic device according to the tenth and eleventh embodiments of the present disclosure.

FIG. 14 is a circuit diagram showing the wiring upon adding the initialization circuit 80 of FIG. 9 to the electronic device 1 of the tenth embodiment or the electronic device 1j of the eleventh embodiment.

In the case where the initialization circuit 80 is added to the electronic device 1i, 1j having the increment unit 23i, the reset signal inputted to the reset terminal 81 is also inputted to the clear terminal of the determination signal delay terminal 234. For this reason, when the reset signal inputted from the reset terminal 81 is the low level, the determination signal delay element 21 is initialized to the low level.

Twelfth Embodiment

Figure 15:
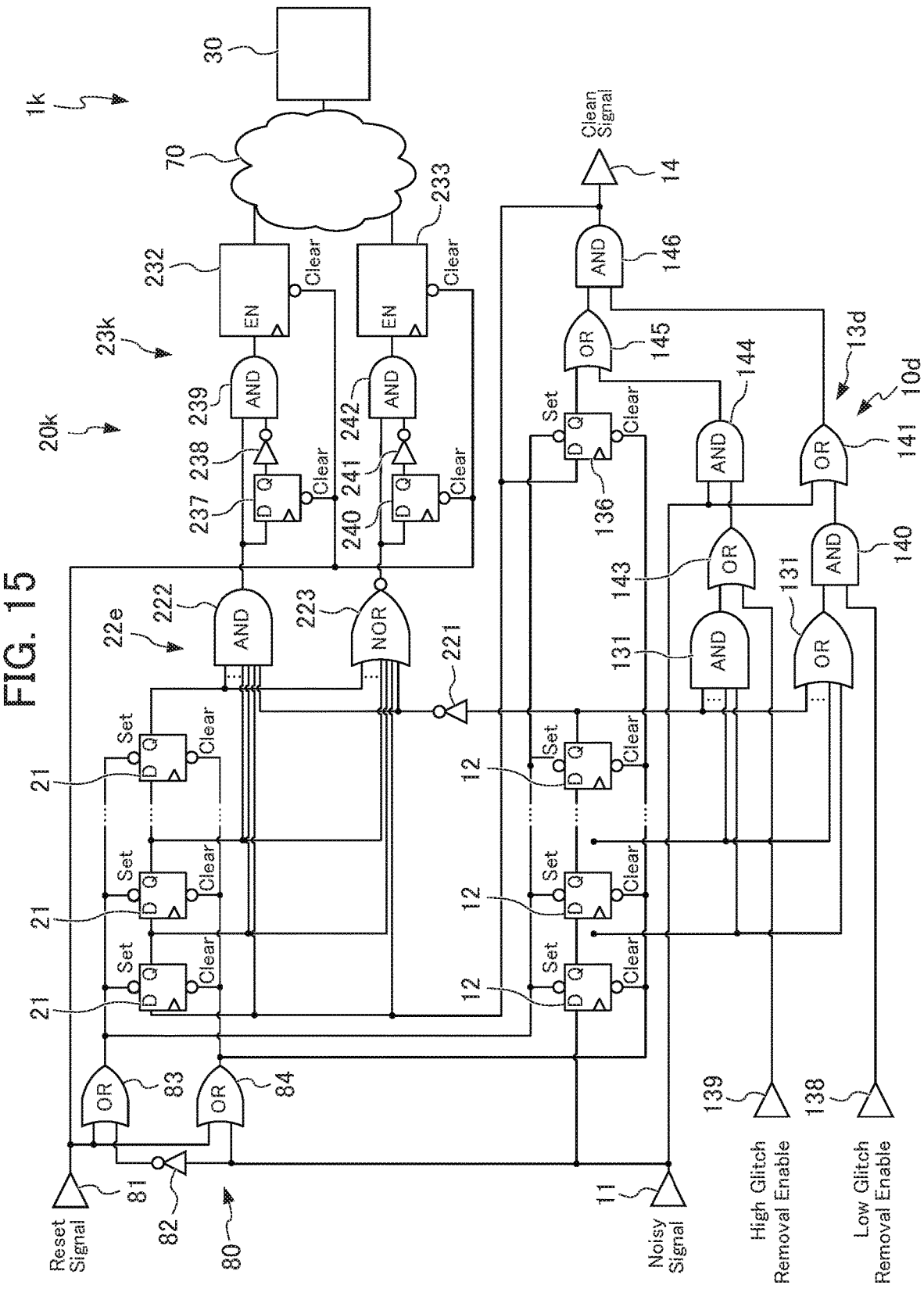
FIG. 15 is a circuit diagram showing an electronic device according to a twelfth embodiment of the present disclosure.

FIG. 15 is a circuit diagram showing an electronic device 1k according a twelfth embodiment of the present disclosure. The electronic device 1k of the present embodiment is a device which removes glitches in the high level direction appearing in the input signal of low level, and removes glitches in the low level direction appearing in the input signal of high level.

The electronic device 1k includes: the glitch removal circuit 10d which removes glitches from the inputted signal; a count unit 20k which counts the number of times that the glitch removal circuit 10d removed glitches; and the electronic device control unit 30 which performs control based on the count number of the count unit 20k.

The glitch removal circuit 10d in the electronic device 1k of the twelfth embodiment is the same as the glitch removal circuit 10d in the electronic device 1d of the fifth embodiment. The electronic device control unit 30 in the electronic device 1k of the twelfth embodiment is the same as the electronic device control unit 30 in the electronic device 1 of the first embodiment.

The count unit 20k includes: n stages of output signal delay elements 21 to which the output signal is inputted; the determination signal generation unit 22e which generates a determination signal indicating the presence/absence of removal of glitches by the glitch removal circuit 10d; and an increment unit 23k which counts the number of times removing glitches based on the determination signal generation unit 22e.

The determination signal generation unit 22e in the count unit 20k of the present embodiment is the same as the determination signal generation unit 22e in the count unit 20e of the sixth embodiment.

The increment unit 23k includes: a first determination signal delay element 237 which latches the first determination signal inputted from the determination AND circuit 222 of the determination signal generation unit 22e; a first determination signal inversion element 238 which inverts the output of the first determination signal delay element 237; a first increment AND circuit 239 which outputs the logical product of the first determination signal outputted from the determination AND circuit 222 and the output of the first determination signal inversion element 238; the first incrementer 232 which increments the count every time the output of the first increment AND circuit 239 becomes the high level; a second determination signal delay element 240 which latches the second determination signal outputted from the determination NOR circuit 223 of the determination signal generation unit 22e; a second determination signal inversion element 241 which inverts the output of the second determination signal delay element 240; a second increment AND circuit 242 which outputs the logical product of the second determination signal outputted from the determination AND circuit 222 and the output of the second determination signal inversion element 241; and the second incrementer 233 which increments the count every time the output of the second increment AND circuit 242 becomes the high level.

The first incrementer 232 counts the asserting edge of glitches in the low level direction removed by the glitch removal circuit 10d. The second incrementer 233 counts the asserting edge of glitches in the high level direction removed by the glitch removal circuit 10d.

The electronic device 1k of the twelfth embodiment explained above, due to separately counting the asserting edge number of times of glitches in the low level direction removed, and the number of asserting edges of glitches in the high level direction removed by the increment unit 23k, can grasp the occurrence status of glitches in more detail.

(Noise Removal System)

Figure 16:
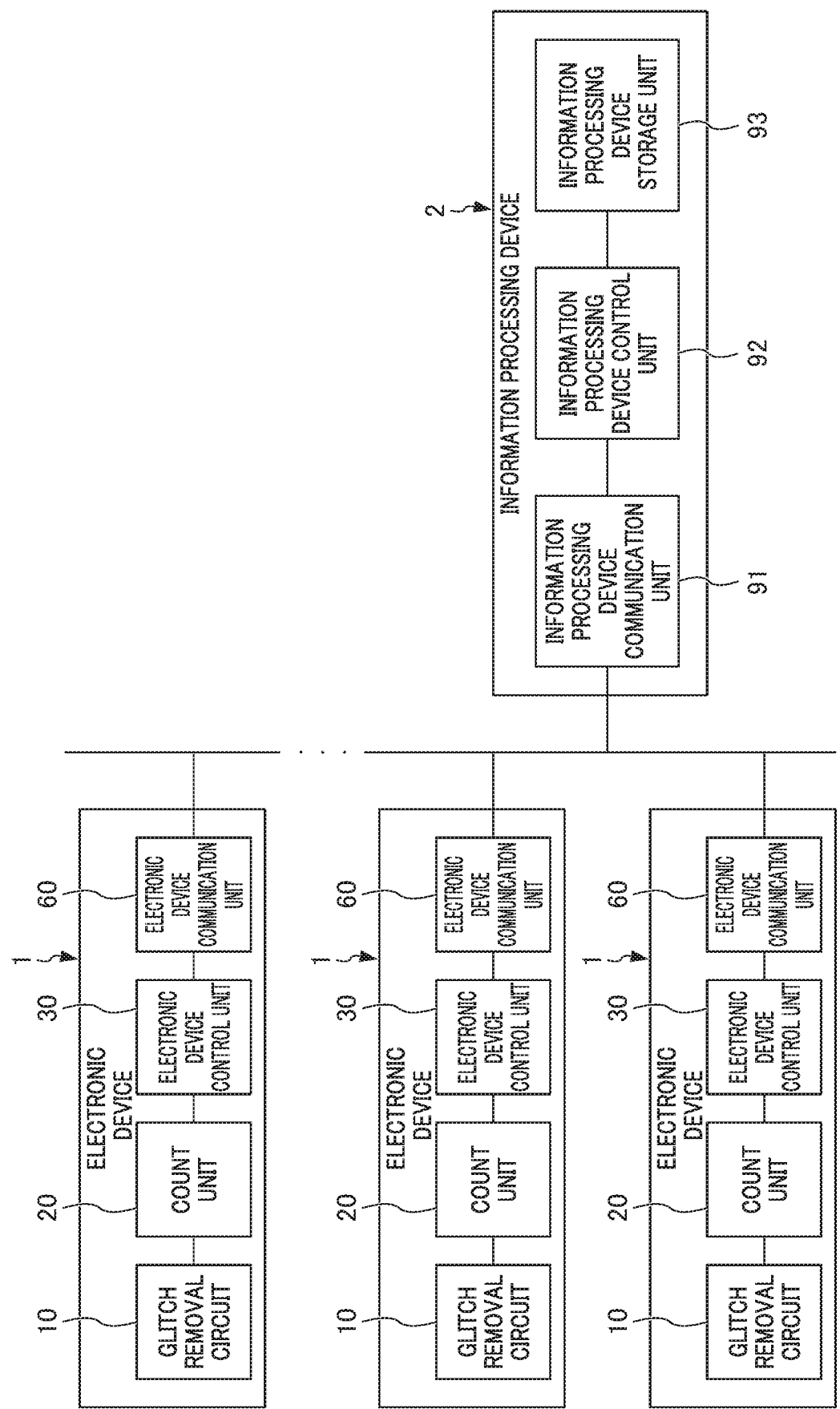
FIG. 16 is a block diagram showing the configuration of an embodiment of a noise removal system according to the present disclosure.

Hereinafter, an embodiment of a noise removal system according to the present disclosure will be explained by referencing FIG. 16. FIG. 16 is a block diagram showing the configuration of an embodiment of a noise removal system according to the present disclosure.

The noise removal system includes a plurality of the electronic devices 1, and the information processing device 1 which communicates with one or a plurality of the electronic devices 1.

The electronic device 1 in the noise removal system of the present embodiment is the same as the electronic device 1 of the first embodiment.

The information processing device 2 includes: an information processing device communication unit 91 which receives the number of times removing glitches (count number) by communicating with the electronic device communication unit 60 of the electronic device 1; an information processing device control unit 92 which controls the information processing device communication unit 91; and an information processing device storage unit 93 which records the count number received by the information processing device communication unit 91.

The information processing device communication unit 91 can be established as a configuration including an Ethernet communication module, wireless communication module, etc., similarly to the electronic device communication unit 60.

The information processing device control unit 92 can be established as a configuration having a processor (CPU) which performs the operations instructed according to a program.

The information processing device storage unit 93 can be established as a configuration having a storage device such as memory or a hard disk drive.

In the information processing device 2, the information processing device control unit 92 acquires the number of times removing glitches counted by each electronic device 1 via the information processing device communication unit 91. The information processing device control unit 92 causes the number of the electronic device 1 and the count number of this electronic device 1 to be stored in the information processing device storage unit 93 to be associated with each other. The information processing device 2 may acquire positional information of the electronic device 1. The positional information may be acquired using a positional information acquisition system such as GPS, or may be obtained from the number of the electronic device 1 based on a pre-set arrangement of electronic devices 1.

Acquisition of the count number from each electronic device 1, and recording such as the count number in the information processing device storage unit 93 are preferably performed periodically or when a predetermined phenomenon such as the occurrence of a fatal error occurs.

The information processing device control unit 92 may analyze the glitch removal number of times acquired from the electronic device 1. The analysis of the glitch removal number of times may adopt the glitch removal number of times of each electronic device 1 as data along a time series, or may adopt positional information of the electronic device 1.

The information processing device 2 may further include an analysis result reporting unit such as a monitor which notifies of the analysis results of the glitch removal number of times. In addition, the information processing device may transmit the analysis result of the glitch removal number of times via the information processing device communication unit 91 to the electronic device 1 or other equipment.

According to the noise removal system according to an embodiment of the present disclosure explained above, effects such as those explained below are exerted.

The noise removal system according to an embodiment of the present disclosure explained above includes the electronic device 1, and the information processing device 2 which receives the count number from the electronic device 1 and records the received count number. It is thereby possible to acquire the number of times that one or a plurality of electronic devices 1 removed glitch noise, and comprehensively grasp the occurrence status of glitches.

Although the respective preferred embodiments of electronic devices of the present disclosure have been explained above, the present disclosure is not to be limited to the aforementioned embodiments, and modifications are possible where appropriate.

For example, in the above-mentioned embodiments, the original signal delay element 12 has been explained by D flip-flop; however, it is not to be limited thereto. The original signal delay element 12 may be a JK-type flip-flop.

EXPLANATION OF REFERENCE NUMERALS

1, 1a, 1b, 1c, 1d, 1e, 1f, 1g, 1h, 1i, 1k electronic device
2 information processing device
10, 10a, 10b, 10c, 10d glitch removal circuit
12 original signal delay element
13, 13a, 13b, 13c, 13d output signal generation unit
20, 20a, 20b, 20c, 20d, 20e, 20i, 20j, 20k count unit
21 output signal delay element
22, 22a, 22b, 22c, 22e determination signal generation unit
23, 23e, 23i, 23k increment unit
30 electronic device control unit (judgment unit)
40 reporting unit
50 electronic device recording unit
60 electronic device communication unit (count transmission unit)
80 initialization circuit
131 output generation OR circuit
132 output generation AND circuit
133 first switch
134 second switch
231, 232, 233 incrementer

What is claimed is:

1. An electronic device having a function of removing a glitch included in a signal, the electronic device comprising:
a glitch removal circuit which removes a glitch from an inputted signal; and
a count unit which counts a number of times removing a glitch.

2. The electronic device according to claim 1,
wherein the glitch removal circuit includes:
n stages of original signal delay elements to which an original signal is inputted, wherein n is an integer of 1 or more; and
an output signal generation unit which generates an output signal from a signal outputted from the original signal delay element and the original signal, and
wherein the count unit includes:
n stages of output signal delay elements to which the output signal is inputted;
a determination signal generation unit which generates a determination signal that indicates presence/absence of removal of a glitch from a current output signal, a signal outputted from the output signal delay element, and a signal outputted from a last stage among the original signal delay elements; and
an increment unit which has an incrementer that increments and retains a number of times removing a glitch, and increments the incrementer based on the determination signal.

3. The electronic device according to claim 2, wherein the determination signal generation unit generates a determination signal having a value indicating an event of removing a glitch, in a case where the current output signal and a signal outputted from all of the output signal delay elements are equal, and the current output signal and a signal outputted from a last stage among the original signal delay elements differing.

4. The electronic device according to claim 2, wherein the increment unit increments a number of times removing a glitch, in a case where the determination signal has a value indicating an event of removing a glitch, and the value differs from a value of a previous determination signal.

5. The electronic device according to claim 2, further comprising an initialization circuit which initializes the original signal delay element, the output signal delay element and the increment unit, in a case where a reset signal is inputted.

6. The electronic device according to claim 2, wherein the output signal generation unit outputs a logical sum of the original signal and a signal outputted from each of the original signal delay elements.

7. The electronic device according to claim 2, wherein the output signal generation unit outputs a logical product of the original signal and a signal outputted from each of the original signal delay elements.

8. The electronic device according to claim 2, wherein the output signal generation unit generates an output signal based on exclusive OR related to each of a logical sum and logical product of the original signal and a signal outputted from each of the n stages of the original signal delay elements.

9. The electronic device according to claim 8, wherein the output signal generation unit further includes a first switch which enables the logical sum, and a second switch which enables the logical product.

10. The electronic device according to claim 1, further comprising:
a determination unit which determines whether a count number of the count unit has exceeded a predetermined threshold value; and
a reporting unit which reports that the count number of the count unit has exceeded the predetermined threshold value.

11. The electronic device according to claim 10, wherein the reporting unit displays on a screen an event of the count number of the count unit having exceeded the predetermined threshold value.

12. The electronic device according to claim 10, wherein the reporting unit externally transmits information indicating an event of the count number of the count unit having exceeded the predetermined threshold value.

13. The electronic device according to claim 1, further comprising a recording unit which leaves in a log the count number of the count unit, periodically or when a predetermined phenomenon occurs.

14. The electronic device according to claim 1, further comprising a count transmission unit which externally transmits the count number of the count unit.

15. A noise removal system, comprising:
the electronic device according to claim 14; and
an information processing device which receives the count number from the electronic device, and records the count number thus received.

* * * * *